(12) United States Patent
Rie et al.

(10) Patent No.: US 12,073,875 B2
(45) Date of Patent: Aug. 27, 2024

(54) RECEIVER WITH PIPELINE STRUCTURE FOR RECEIVING MULTI-LEVEL SIGNAL AND MEMORY DEVICE INCLUDING THE SAME

(71) Applicant: SAMSUNG ELECTRONICS CO., LTD., Suwon-si (KR)

(72) Inventors: Hyunsub Rie, Yongin-si (KR); Eunseok Shin, Seoul (KR); Youngdon Choi, Seoul (KR); Changsoo Yoon, Seoul (KR); Hyunyoon Cho, Uiwang-si (KR); Junghwan Choi, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 154 days.

(21) Appl. No.: 17/943,448

(22) Filed: Sep. 13, 2022

(65) Prior Publication Data
US 2023/0116188 A1    Apr. 13, 2023

(30) Foreign Application Priority Data

Oct. 7, 2021  (KR) .......................... 10-2021-0133154

(51) Int. Cl.
*G11C 16/34* (2006.01)
*G11C 11/4096* (2006.01)
*H03M 1/12* (2006.01)

(52) U.S. Cl.
CPC ......... *G11C 11/4096* (2013.01); *H03M 1/124* (2013.01); *G11C 16/34* (2013.01)

(58) Field of Classification Search
CPC .................................................. G11C 16/3454
See application file for complete search history.

(56) References Cited

U.S. PATENT DOCUMENTS

| 7,124,221 | B1 | 10/2006 | Zerbe et al. |
| 7,327,184 | B2 | 2/2008 | Sung et al. |
| 8,045,647 | B2 | 10/2011 | Oh et al. |
| | | (Continued) | |

FOREIGN PATENT DOCUMENTS

| JP | 2001-077870 A | 3/2001 |
| JP | 2020-043479 A | 3/2020 |
| WO | WO 2013-095085 A1 | 6/2013 |

OTHER PUBLICATIONS

Extended European Search Report dated Mar. 1, 2023.

*Primary Examiner* — Jason Lappas
(74) *Attorney, Agent, or Firm* — Muir Patent Law, PLLC

(57) ABSTRACT

A receiver receiving a multi-level signal includes a sample and hold circuit, first and second analog-to-digital converting circuits, and a digital-to-analog converting circuit. The sample and hold circuit generates a sample data signal by sampling and holding an input data signal. The first analog-to-digital converting circuit generates a first bit of output data based on the input data signal and a first selection reference voltage among a plurality of reference voltages. The digital-to-analog converting circuit selects at least one additional selection reference voltage from among the plurality of reference voltages based on the first bit of the output data. The second analog-to-digital converting circuit generates at least one additional bit of the output data based on the sample data signal and the at least one additional selection reference voltage.

20 Claims, 21 Drawing Sheets

(56) References Cited

U.S. PATENT DOCUMENTS

| | | |
|---|---|---|
| 9,338,040 B2 | 5/2016 | Longo et al. |
| 9,544,169 B2 | 1/2017 | Zerbe et al. |
| 9,853,841 B1 | 12/2017 | Ho |
| 10,778,205 B2 | 9/2020 | Kim et al. |
| 10,985,953 B2 | 4/2021 | Lin et al. |
| 2008/0143576 A1 | 6/2008 | Chen et al. |
| 2011/0085385 A1* | 4/2011 | Park .................... G11C 11/5628 365/185.2 |

* cited by examiner

1000b

RECEIVER WITH PIPELINE STRUCTURE FOR RECEIVING MULTI-LEVEL SIGNAL AND MEMORY DEVICE INCLUDING THE SAME

CROSS-REFERENCE TO RELATED APPLICATION

This application claims priority under 35 U.S.C. § 119 to Korean Patent Application No. 10-2021-0133154 filed on Oct. 7, 2021, in the Korean Intellectual Property Office (KIPO), the contents of which are herein incorporated by reference in their entirety.

BACKGROUND

1. Field

Example embodiments relate generally to semiconductor integrated circuits, and more particularly to receivers with pipeline structures for receiving multi-level signals, and memory devices including the receivers.

2. Description of the Related Art

Semiconductor memory devices can generally be divided into two categories depending upon whether or not they retain stored data when disconnected from a power supply. These categories include volatile memory devices, which lose stored data when disconnected from power, and nonvolatile memory devices, which retain stored data when disconnected from power. Volatile memory devices may perform read and write operations at a high speed, while contents stored therein may be lost at power-off. Nonvolatile memory devices may retain contents stored therein even at power-off, which means they may be used to store data that must be retained regardless of whether they are powered.

SUMMARY

An embodiment is directed to a receiver configured to receive a multi-level signal having three or more voltage levels that are different from each other, and including a sample and hold circuit, a first analog-to-digital converting circuit, a digital-to-analog converting circuit and a second analog-to-digital converting circuit. The sample and hold circuit generates a sample data signal by sampling and holding an input data signal that is the multi-level signal. The first analog-to-digital converting circuit generates a first bit of output data based on the input data signal and a first selection reference voltage among a plurality of reference voltages. The output data includes two or more bits that are different from each other. The digital-to-analog converting circuit selects at least one additional selection reference voltage from among the plurality of reference voltages based on the first bit of the output data. The at least one additional selection reference voltage is different from the first selection reference voltage. The second analog-to-digital converting circuit generates at least one additional bit of the output data based on the sample data signal and the at least one additional selection reference voltage. The at least one additional bit is different from the first bit.

An embodiment is directed to a memory device, including a receiver and a memory cell array. The receiver receives a multi-level signal having three or more voltage levels that are different from each other. The memory cell array performs a data write operation based on the input data signal. The receiver includes a sample and hold circuit, a first analog-to-digital converting circuit, a digital-to-analog converting circuit and a second analog-to-digital converting circuit. The sample and hold circuit generates a sample data signal by sampling and holding an input data signal that is the multi-level signal. The first analog-to-digital converting circuit generates a first bit of output data based on the input data signal and a first selection reference voltage among a plurality of reference voltages. The output data includes two or more bits that are different from each other. The digital-to-analog converting circuit selects at least one additional selection reference voltage from among the plurality of reference voltages based on the first bit of the output data. The at least one additional selection reference voltage is different from the first selection reference voltage. The second analog-to-digital converting circuit generates at least one additional bit of the output data based on the sample data signal and the at least one additional selection reference voltage. The at least one additional bit is different from the first bit.

An embodiment is directed to a receiver configured to receive a multi-level signal having a first voltage level, a second voltage level lower than the first voltage level, a third voltage level lower than the second voltage level, and a fourth voltage level lower than the third voltage level, and including a sample and hold circuit, a first sense amplifier, a multiplexer and a second sense amplifier. The sample and hold circuit generates a sample data signal by sampling an input data signal that is the multi-level signal during a first time interval and by holding the input data signal during a second time interval subsequent to the first time interval. The first sense amplifier generates a most significant bit (MSB) of output data based on the input data signal and a first reference voltage during a first sub-time interval in the second time interval. The first reference voltage has a voltage level between the second and third voltage levels. The multiplexer selects one of a second reference voltage and a third reference voltage based on the MSB of the output data. The second reference voltage has a voltage level between the first and second voltage levels. The third reference voltage has a voltage level between the third and fourth voltage levels. The second sense amplifier generates a least significant bit (LSB) of the output data based on the sample data signal and one of the second and third reference voltages output from the multiplexer during a second sub-time interval subsequent to the first sub-time interval in the second time interval. In response to a voltage level of the input data signal being higher than the voltage level of the first reference voltage, the MSB of the output data has a first logic level, and the multiplexer selects and outputs the second reference voltage. In response to the voltage level of the input data signal being lower than the voltage level of the first reference voltage, the MSB of the output data has a second logic level different from the first logic level, and the multiplexer selects and outputs the third reference voltage.

BRIEF DESCRIPTION OF THE DRAWINGS

Features will become apparent to those of skill in the art by describing in detail example embodiments with reference to the attached drawings in which.

DETAILED DESCRIPTION

Figure 1:
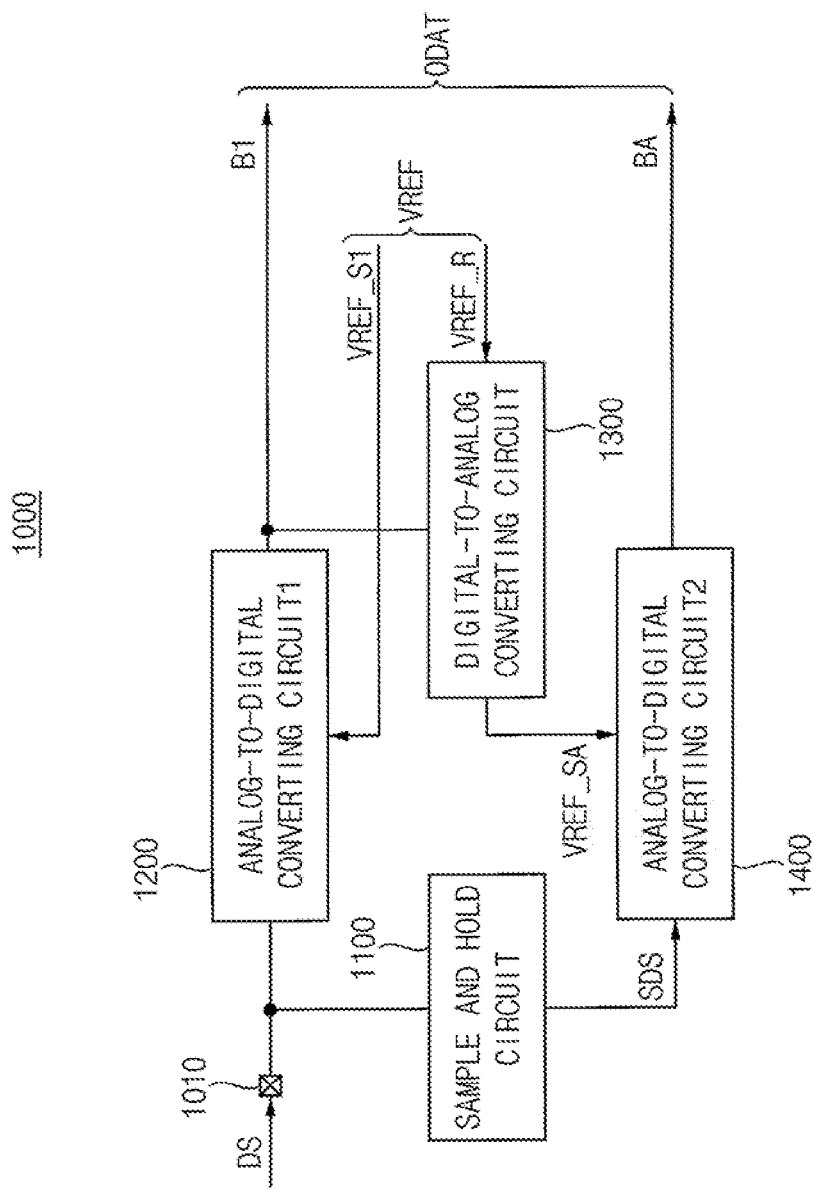
FIG. 1 is a block diagram illustrating a receiver according to an example embodiment.

FIG. 1 is a block diagram illustrating a receiver according to an example embodiment.

Referring to FIG. 1, a receiver 1000 may include a sample and hold circuit 1100, a data input pad 1010, a first analog-to-digital converting circuit 1200, a digital-to-analog converting circuit 1300, and a second analog-to-digital converting circuit 1400.

The receiver 1000 may receive an input data signal DS, which is a multi-level signal having three or more voltage levels, and may generate output data ODAT, which is multi-bit data including two or more bits based on the input data signal DS.

The multi-level signal may have one of three or more voltage levels that are different from each other during one unit interval (UI). The multi-bit data may include two or more bits, e.g., two or more bits that are different, e.g., a different positions, from each other, e.g., most- and least-significant bits or otherwise representing different bits of the data.

The receiver 1000 may be included in various communication systems and/or signal transmission systems, and may be included in, e.g., a memory device and/or a memory system. Configurations of the receiver 1000, the memory device, the memory system and the multi-level signal will be described in detail below.

The data input pad 1010 may be connected to the sample and hold circuit 1100 and the first analog-to-digital converting circuit 1200, and may receive the input data signal DS. For example, the data input pad 1010 may be a contact pad or a contact pin.

The sample and hold circuit 1100 may generate a sample data signal SDS by sampling and holding the input data signal DS, which is the multi-level signal having one of the three or more voltage levels that are different from each other. A detailed configuration of the sample and hold circuit 1100 will be described with reference to FIGS. 6, 7, and 8.

The first analog-to-digital converting circuit 1200 may generate a first bit B1 of the output data ODAT, which is the multi-bit data including the two or more bits, which may be different from each other, based on the input data signal DS and a first selection reference voltage VREF_S1 among a plurality of reference voltages VREF. The plurality of reference voltages VREF may have different voltage levels (or reference levels).

In an example embodiment, the first analog-to-digital converting circuit 1200 may include one sense amplifier. The first bit B1 may be a most significant bit (MSB) of the output data ODAT, the first selection reference voltage VREF_S1 may be a reference voltage corresponding to a median value among the plurality of reference voltages VREF, and the sense amplifier included in the first analog-to-digital converting circuit 1200 may be used to decide, judge, or identify the MSB of the output data ODAT.

The digital-to-analog converting circuit 1300 may select at least one additional selection reference voltage VREF_SA from among the plurality of reference voltages VREF based on the first bit B1 of the output data ODAT, the at least one additional selection reference voltage VREF_SA being different from the first selection reference voltage VREF_S1. For example, the digital-to-analog converting circuit 1300 may receive remaining reference voltages VREF_R other than the first selection reference voltage VREF_S1 among the plurality of reference voltages VREF, and may select the at least one additional selection reference voltage VREF_SA from among the remaining reference voltages VREF_R.

The second analog-to-digital converting circuit 1400 may generate at least one additional bit BA of the output data ODAT based on the sample data signal SDS and the at least one additional selection reference voltage VREF_SA, the at least one additional bit BA being different from the first bit B1. For example, the at least one additional bit BA may be at least one of bits of the output data ODAT other than the first bit B1.

In an example embodiment, the digital-to-analog converting circuit 1300 may include one or more multiplexers, and the second analog-to-digital converting circuit 1400 may include one or more sense amplifiers.

In an example embodiment, the number of multiplexers included in the digital-to-analog converting circuit 1300 and the number of sense amplifiers included in the second analog-to-digital converting circuit 1400 may be determined based on the number of bits of the output data ODAT. For example, when the number of bits of the output data ODAT is X, where X is a natural number greater than or equal to two, the number of the at least one additional bit BA may be (X−1), and the digital-to-analog converting circuit 1300 and the second analog-to-digital converting circuit 1400 may include (X−1) multiplexers and (X−1) sense amplifiers, respectively. Thus, the receiver 1000 may include a total of X sense amplifiers, and the number of sense amplifiers included in the receiver 1000 may be less than the number of the plurality of reference voltages VREF.

In an example embodiment, each of the first and second analog-to-digital converting circuits 1200 and 1400 may be referred to as a slicer circuit, a decision circuit, or the like.

In an example embodiment, the first and second analog-to-digital converting circuits 1200 and 1400 may directly generate the bits B1 and BA of the output data ODAT, and thus a decoder circuit that decodes the outputs of the first and second analog-to-digital converting circuits 1200 and 1400 may be omitted.

In an example embodiment, the receiver 1000 may sequentially generate the bits B1 and BA of the output data ODAT in a pipeline scheme. In other words, a timing at which the first analog-to-digital converting circuit 1200 generates the first bit B1 of the output data ODAT and a timing at which the second analog-to-digital converting circuit 1400 generates the at least one additional bit BA of the output data ODAT may be different from each other.

For example, the sample and hold circuit 1100 may sample the input data signal DS during a first time interval (or a first period), and may hold the input data signal DS during a second time interval (or a second period) subsequent to or after the first time interval. The first and second time intervals may be referred to as a sampling interval and a holding interval, respectively. The first analog-to-digital converting circuit 1200 may generate the first bit B1 of the output data ODAT during a first sub-time interval in the second time interval. The second analog-to-digital converting circuit 1400 may generate the at least one additional bit BA of the output data ODAT during a second sub-time interval subsequent to the first sub-time interval in the second time interval. A detailed operation of the receiver 1000 will be described with reference to FIG. 4.

In an example embodiment, the input data signal DS may be a single-ended signal. The receiver 1000 may operate in a pseudo-differential scheme based on the input data signal DS, which is the single-ended signal, and the plurality of different reference voltages VREF.

In the receiver 1000 according to an example embodiment, the input data signal DS that is generated based on a multi-level signaling scheme is received. The multi-level signaling scheme may be used as a means of compressing the bandwidth required to transmit data at a given bit rate. In a simple binary scheme, two single symbols, usually two voltage levels, may be used to represent '1' and '0', and thus the symbol rate may be equal to the bit rate. In contrast, the principle of the multi-level signaling scheme may be to use a larger alphabet of m symbols to represent data, so that each symbol may represent more than one bit of data. As a result, the number of symbols that needs to be transmitted may be less than the number of bits (e.g., the symbol rate may be less than the bit rate), and thus the bandwidth may be compressed. The alphabet of symbols may be constructed from a number of different voltage levels. For example, in a four-level scheme, groups of two data bits may be mapped to one of four symbols. Only one symbol need be transmitted for each pair of data bits, so the symbol rate may be a half of the bit rate. In other words, the multi-level signaling scheme may be used to increase a data transmission (or transfer) rate without increasing the frequency of data transmission and/or a transmission power of the communicated data.

An example of one type of the multi-level signaling scheme may be a pulse amplitude modulation (PAM) scheme, where a unique symbol of a multi-level signal may represent a plurality of bits of data. The number of possible pulse amplitudes in a digital PAM scheme may be some power of two. For example, there may be $2^2$ possible discrete pulse amplitudes in a 4-level PAM (e.g., in PAM4), there may be $2^3$ possible discrete pulse amplitudes in an 8-level PAM (e.g., in PAM8), and there may be $2^4$ possible discrete pulse amplitudes in a 16-level PAM (e.g., in PAM16). Example embodiments may also be applied to or employed in a K-level PAM (e.g., PAM(K)) having K possible pulse amplitudes, where K is a natural number greater than or equal to three.

The receiver 1000 according to an example embodiment may operate based on a pipeline scheme in which the bits B1 and BA of the output data ODAT are determined at different timings. To operate based on the pipeline scheme, the receiver 1000 may include the sample and hold circuit 1100 and the analog-to-digital converting circuits 1200 and 1400, and thus the number of sense amplifiers included in the receiver 1000 may be reduced. Accordingly, a capacitance (e.g., Cio) viewed from the input terminal to the inside of the receiver 1000 may be reduced, and power consumption and circuit size may be reduced without degrading the performance of the receiver 1000.

Figure 2A:
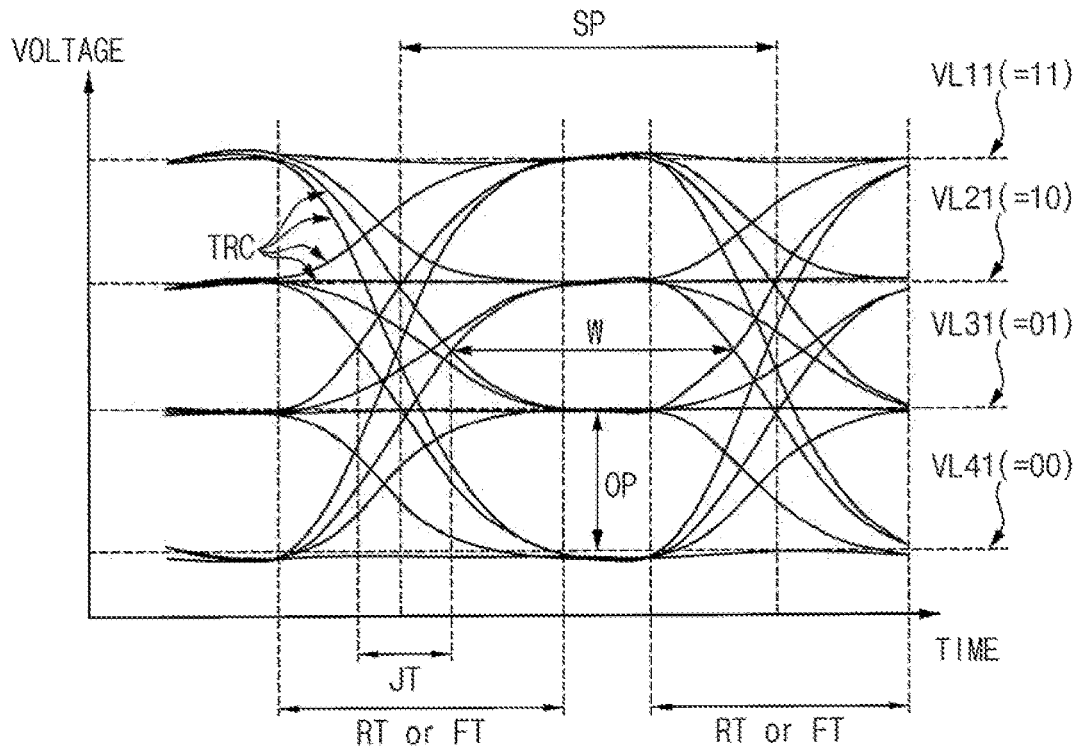
FIGS. 2A and 2B are diagrams for describing a data signal that is input to a receiver according to an example embodiment.
Figure 2B:
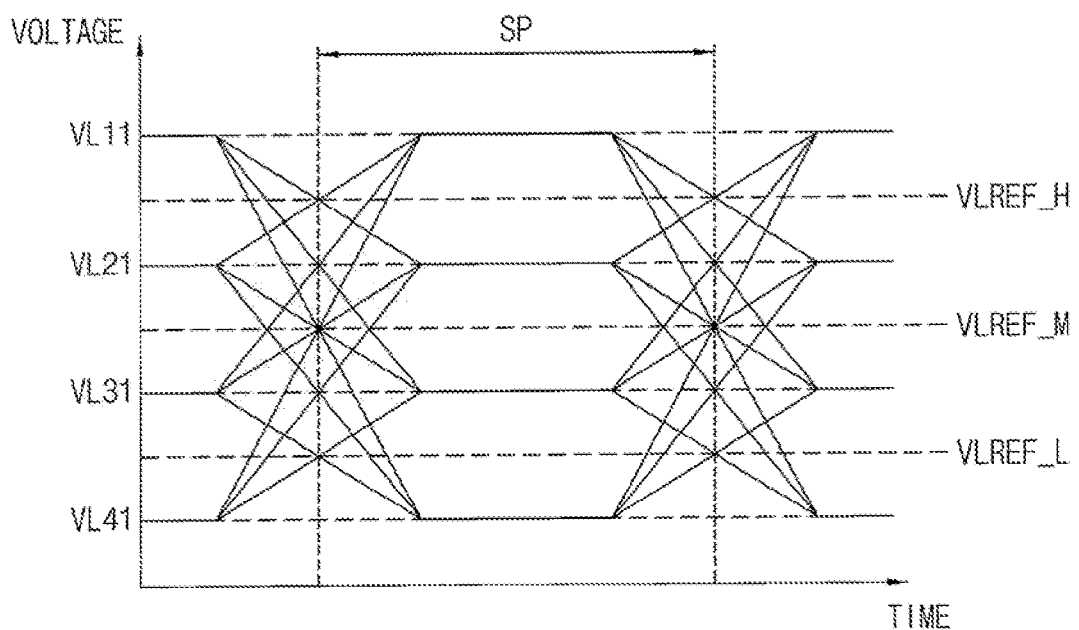

FIGS. 2A and 2B are diagrams for describing a data signal that is input to a receiver according to an example embodiment.

FIG. 2A illustrates an ideal eye diagram of a data signal (e.g., a PAM4 signal) generated based on the 4-level scheme (e.g., the PAM4 scheme) that is an example of the multi-level signaling scheme (e.g., the PAM scheme). FIG. 2B is a diagram illustrating a simplified ideal eye diagram of FIG. 2A.

Referring to FIG. 2A, an eye diagram may be used to indicate the quality of signals in high-speed transmissions. For example, the eye diagram may represent four symbols of a signal (e.g., '00', '01', '10', and '11'), and each of the four symbols may be represented by a respective one of different voltage levels (e.g., voltage amplitudes) VL11, VL21, VL31, and VL41. The eye diagram may be used to provide a visual indication of the health of the signal integrity, and may indicate noise margins of the data signal. For example, when a binary code is used as illustrated in FIG. 2A, the voltage levels VL11, VL21, VL31, and VL41 may be mapped to '11', '10', '01', and '00', respectively. For another example, when a Gray code is used although not illustrated, the voltage levels VL11, VL21, VL31, and VL41 may be mapped to '10', '11', '01', and '00', respectively.

To generate the eye diagram, an oscilloscope or other computing devices may sample a digital signal according to a sample period SP (e.g., a unit interval or a bit period). The sample period SP may be defined by a clock associated with the transmission of the measured signal. The oscilloscope or other computing devices may measure the voltage level of the signal during the sample period SP to form the plurality of traces TRC. Various characteristics associated with the measured signal may be determined by overlaying the plurality of traces TRC.

The eye diagram may be used to identify a number of characteristics of a communication signal such as jitter, crosstalk, electromagnetic interference (EMI), signal loss, signal-to-noise ratio (SNR), other characteristics, or combinations thereof. For example, a width W of an eye in the eye diagram may be used to indicate a timing synchronization of the measured signal or jitter effects of the measured signal. For example, the eye diagram may indicate an eye opening OP, which represents a peak-to-peak voltage difference between the various voltage levels VL11, VL21, VL31, and VL41. The eye opening OP may be related to a voltage margin for discriminating between different voltage levels VL11, VL21, VL31, and VL41 of the measured signal. For example, the eye diagram may be used to identify a rise time RT and/or a fall time FT for transitions from a first amplitude to a second amplitude. The rise time RT or the fall time FT may indicate a time required for transitioning from one voltage level to another voltage level, may be related to or associated with a rising edge and a falling edge, respectively. For example, the eye diagram may be used to identify the amount of jitter JT in the measured signal. The jitter JT may refer to a timing error that results from a misalignment of rise and fall times. The jitter JT may occur when the rising edge or the falling edge occurs at a time that is different from an ideal time defined by the data clock. The jitter JT may be caused by signal reflections, intersymbol interference, crosstalk, process-voltage-temperature (PVT) variations, random jitter, additive noise, or combinations thereof.

Referring to FIG. 2B, different first, second, third, and fourth voltage levels VL11, VL21, VL31, and VL41 of the data signal that is the PAM4 signal are illustrated, and different first, second and third reference levels VLREF_H, VLREF_M, and VLREF_L for sensing or detecting the level of the data signal are illustrated. For example, the number of the reference levels may be less than the number of the voltage levels of the data signal by one.

The first voltage level VL11 may be the highest voltage level among the voltage levels VL11, VL21, VL31, and VL41. The second voltage level VL21 may be lower than the first voltage level VL11. The third voltage level VL31 may be lower than the second voltage level VL21. The fourth voltage level VL41 may be lower than the third voltage level VL31 and may be the lowest voltage level among the voltage levels VL11, VL21, VL31, and VL41.

In addition, the first reference level VLREF_H may be a voltage level between the first and second voltage levels VL11 and VL21. The second reference level VLREF_M may be a voltage level between the second and third voltage levels VL21 and VL31. The third reference level VLREF_L may be a voltage level between the third and fourth voltage levels VL31 and VL41.

The voltage level (e.g., the symbol) of the data signal may be decided or determined based on a result of comparing the data signal with the reference levels VLREF_H, VLREF_M, and VLREF_L.

Hereinafter, example embodiments will be described in detail based on the PAM4 scheme (or PAM8 scheme), but example embodiments may be applied or employed to the PAM(K) scheme having K possible pulse amplitudes.

Figure 3:
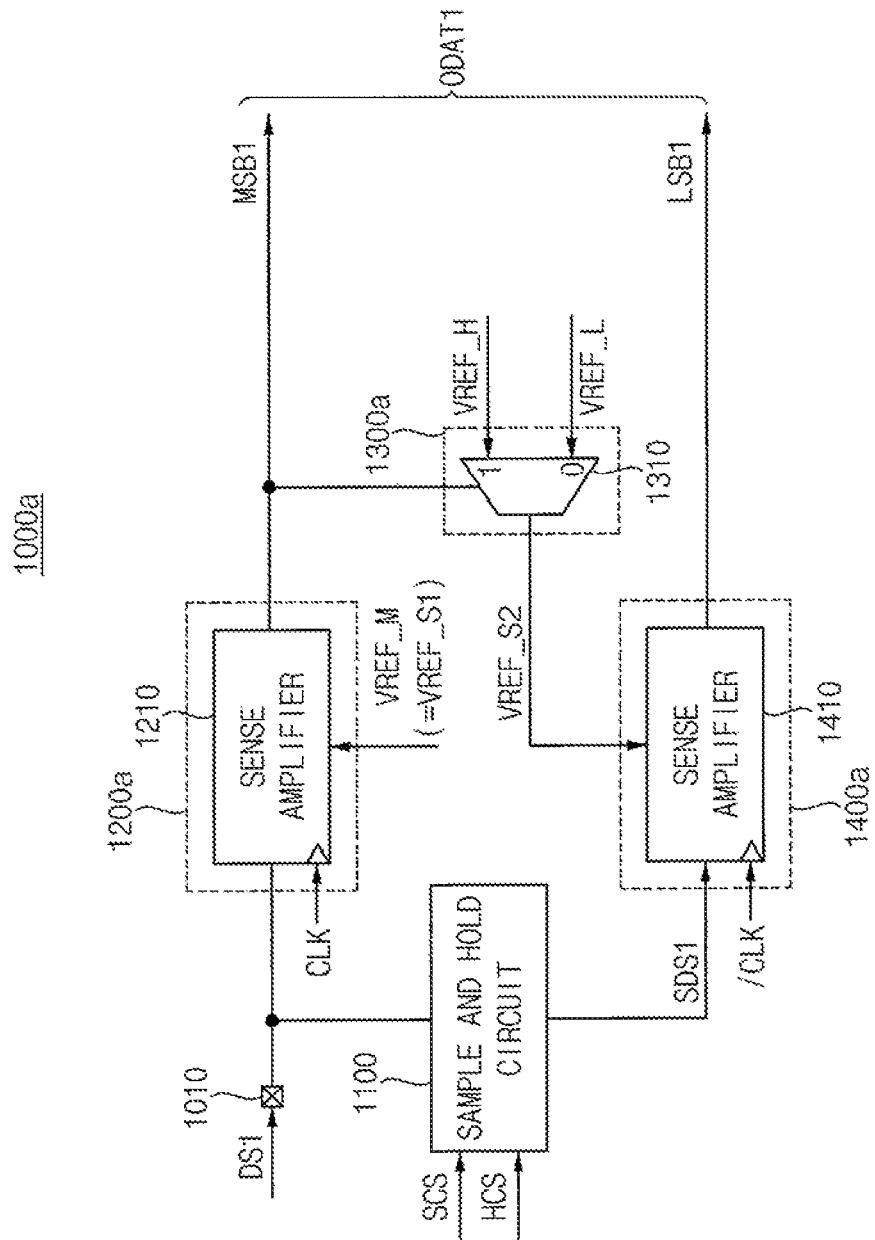
FIG. 3 is a block diagram illustrating an example of a receiver of FIG. 1.

FIG. 3 is a block diagram illustrating an example of a receiver of FIG. 1.

Referring to FIG. 3, a receiver 1000a may include a sample and hold circuit 1100, a data input pad 1010, a first analog-to-digital converting circuit 1200a, a digital-to-analog converting circuit 1300a, and a second analog-to-digital converting circuit 1400a.

The receiver 1000a may be a PAM4 receiver that receives an input data signal DS1 that is generated based on the PAM4 scheme and/or is the PAM4 signal.

The data input pad 1010 may receive the input data signal DS1 having one of the first, second, third, and fourth voltage levels VL11, VL21, VL31, and VL41 in FIGS. 2A and 2B during one unit interval.

The sample and hold circuit 1100 may be substantially the same as the sample and hold circuit 1100 in FIG. 1. The sample and hold circuit 1100 may sample the input data signal DS1 based on a sample control signal SCS, may hold the input data signal DS1 based on a hold control signal HCS, and may output a sample data signal SDS1.

The first analog-to-digital converting circuit 1200a may include a first sense amplifier 1210.

The digital-to-analog converting circuit 1300a may include a multiplexer 1310.

The second analog-to-digital converting circuit 1400a may include a second sense amplifier 1410.

The first sense amplifier 1210 may generate a first bit MSB1 of output data ODAT1 based on a clock signal CLK, the input data signal DS1, and a second reference voltage VREF_M. For example, the second reference voltage VREF_M may have the second reference level VLREF_M in FIG. 2B, and the first bit MSB1 may be an MSB of the output data ODAT1. In the example of FIG. 3, the second reference voltage VREF_M may be determined and provided as the first selection reference voltage VREF_S1.

The multiplexer 1310 may output one of a first reference voltage VREF_H and a third reference voltage VREF_L as a second selection reference voltage VREF_S2 based on the first bit MSB1 of the output data ODAT1. For example, the first reference voltage VREF_H may have the first reference level VLREF_H in FIG. 2B, the third reference voltage VREF_L may have the third reference level VLREF_L in FIG. 2B, and the second selection reference voltage VREF_S2 may be included in the at least one additional selection reference voltage VREF_SA. In other words, one of the first and third reference voltages VREF_H and VREF_L may be determined and provided as the second selection reference voltage VREF_S2.

In an example embodiment, when a voltage level of the input data signal DS1 is higher than the second reference level VLREF_M, the first reference voltage VREF_H may be determined and provided as the second selection reference voltage VREF_S2. When the voltage level of the input data signal DS1 is lower than the second reference level VLREF_M, the third reference voltage VREF_L may be determined and provided as the second selection reference voltage VREF_S2.

The second sense amplifier 1410 may generate a second bit LSB1 of the output data ODAT1 based on an inverted clock signal /CLK, the input data signal DS1, and the second selection reference voltage VREF_S2 (e.g., one of the first and third reference voltages VREF_H and VREF_L). For example, the second bit LSB1 may be a least significant bit (LSB) of the output data ODAT1.

In an example embodiment, although not illustrated in FIG. 3, the first analog-to-digital converting circuit 1200a may further include a first pre-amplifier that is disposed in front of the first sense amplifier 1210, and the second analog-to-digital converting circuit 1400a may further include a second pre-amplifier that is disposed in front of the second sense amplifier 1410.

In an example embodiment, each of the first and second sense amplifiers 1210 and 1410 may include a plurality of transistors.

A general receiver operating based on the PAM4 scheme includes three (=$2^2$−1) sense amplifiers for receiving the PAM4 signal. In contrast, the receiver 1000a according to the present example embodiment may include two sense amplifiers 1210 and 1410 and one sample and hold circuit 1100, and may operate based on the pipelined scheme. Therefore, the receiver 1000a may be more advantageous in terms of internal capacitance, power consumption, and size.

Figure 4:
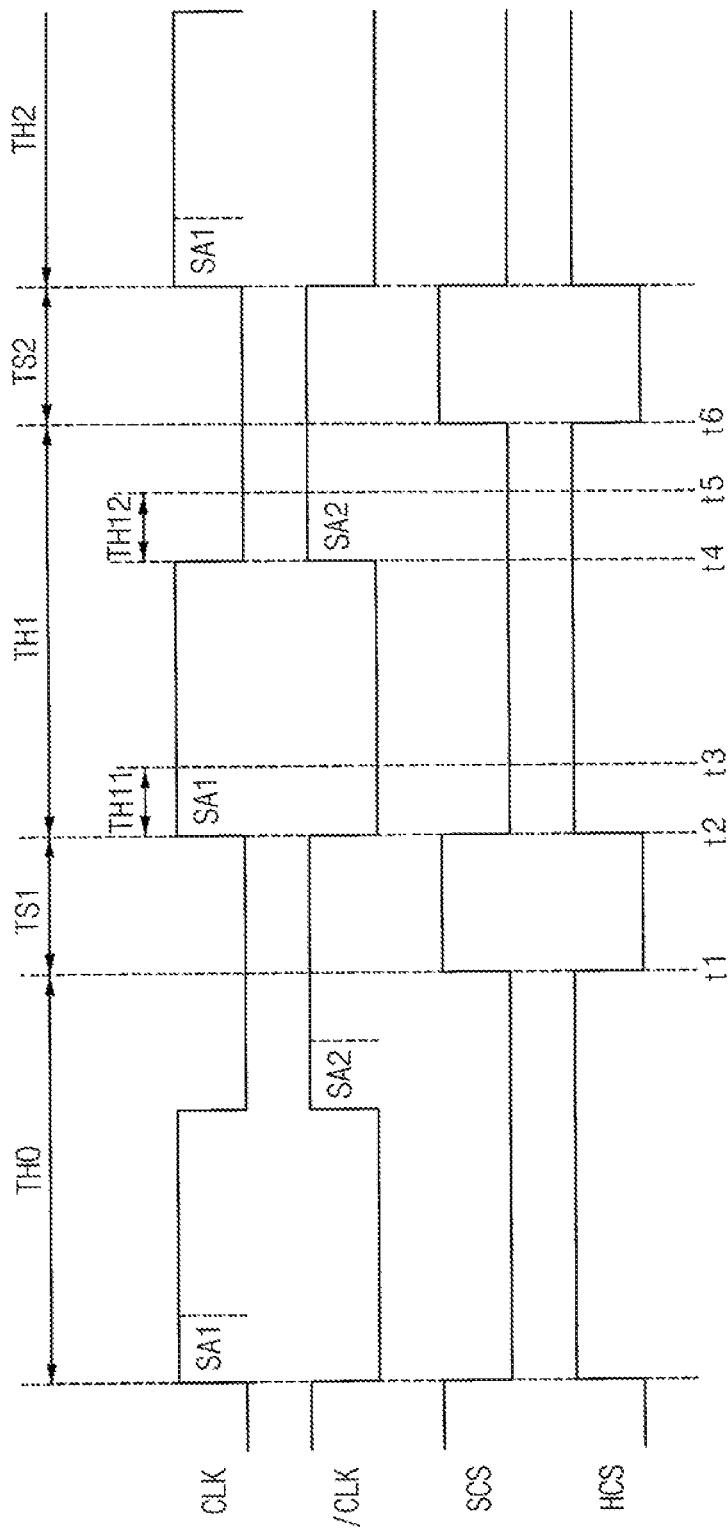
FIGS. 4 and 5 are diagrams for describing an operation of a receiver of FIG. 3.
Figure 5:
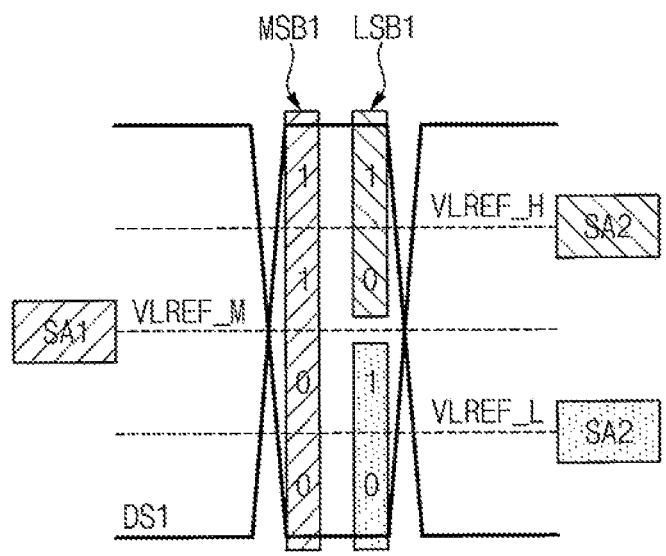

FIGS. 4 and 5 are diagrams for describing an operation of a receiver of FIG. 3.

FIG. 4 illustrates operation timings of the clock signal CLK, the inverted clock signal /CLK, the sample control signal SCS, and the hold control signal HCS that are provided to the receiver 1000a.

In FIGS. 4 and 5, TS1 and TS2 represent sampling intervals (e.g., the first time interval described with reference to FIG. 1) for performing a sampling operation, TH0, TH1, and TH2 represent holding intervals (e.g., the second time interval described with reference to FIG. 1) for performing a holding operation, and SA1 and SA2 represent operations of the first sense amplifier 1210 and the second sense amplifier 1410 in FIG. 3, respectively.

The first sense amplifier 1210 and the second sense amplifier 1410 may operate in response to a rising edge of the clock signal CLK and a rising edge of the inverted clock signal /CLK, respectively.

While the receiver 1000*a* is operating (or driving), the sampling intervals TS1 and TS2 and the holding intervals TH0, TH1, and TH2 may be alternately arranged such that the sampling operation and the holding operation are alternately performed, and one sampling interval (e.g., the sampling interval TS1) and one holding interval (e.g., the holding interval TH1) may form one data output interval. In addition, a plurality of data output intervals may be repeatedly arranged, and one value of the output data ODAT1 may be generated and output during one data output interval. For example, one data output period may correspond to the sample period SP in FIG. 2A.

Hereinafter, an operation during the first data output interval including the first sampling interval TS1 and the first holding interval TH1 will be described in detail.

Before a rising edge of the clock signal CLK, at time t1, the sample control signal SCS may be activated such that the receiver 1000*a* enters the first sampling interval TS1. During the first sampling interval TS1, the sample and hold circuit 1100 in FIG. 3 may sample data that is the same as data input to the first sense amplifier SA1 at the rising edge of the clock signal CLK.

Thereafter, at time t2, the rising edge of the clock signal CLK may be input, the sample control signal SCS may be deactivated such that the receiver 1000*a* exits the first sampling interval TS1, and the hold control signal HCS may be activated such that the receiver 1000*a* enters the first holding interval TH1. During the first holding interval TH1, the sample and hold circuit 1100 may hold and output the data that is sampled during the first sampling interval TS1.

In addition, during a first sub-time interval TH11 between time t2 and time t3, the first sense amplifier SA1 may determine and generate the first bit MSB1 of the output data ODAT1 in response to the rising edge of the clock signal CLK. A value of the first bit MSB1 may be maintained during the first holding interval TH1, and the multiplexer 1310 in FIG. 3 may determine and provide a reference voltage that is to be used by the second sense amplifier SA2 based on the first bit MSB1.

Thereafter, at time t4, a falling edge of the clock signal CLK may be input. During a second sub-time interval TH12 between time t4 and time t5, the second sense amplifier SA2 may determine and generate the second bit LSB1 of the output data ODAT1 in response to the falling edge of the clock signal CLK (e.g., in response to a rising edge of the inverted clock signal/CLK).

Thereafter, at time t6, the hold control signal HCS may be deactivated such that the receiver 1000*a* exits the first holding interval TH1.

In addition, at time t6, the sample control signal SCS may be activated such that the receiver 1000*a* enters the second sampling interval TS2. An operation during a second data output interval including the second sampling interval TS2 and the second holding interval TH2 may be performed similarly to the above-described operation during the first data output interval.

Referring to FIG. 5, an example where the voltage levels VL11, VL21, VL31, and VL41 of the input data signal DS1 received by the receiver 1000*a* are mapped to '11', '10', '01', and '00', respectively, is illustrated.

In the first sub-time interval TH11 in FIG. 4, the first sense amplifier SA1 may determine the first bit MSB1 of the output data ODAT1 based on the second reference voltage VREF_M having the second reference level VLREF_M. For example, when the voltage level of the input data signal DS1 is higher than the second reference level VLREF_M, the first bit MSB1 having a first logic level (e.g., '1') may be generated. When the voltage level of the input data signal DS1 is lower than the second reference level VLREF_M, the first bit MSB1 having a second logic level (e.g., '0') may be generated.

In the second sub-time interval TH12 in FIG. 4, the second sense amplifier SA2 may determine the second bit LSB1 of the output data ODAT1 based on the first reference voltage VREF_H having the first reference level VLREF_H or the third reference voltage VREF_L having the third reference level VLREF_L. For example, the first reference voltage VREF_H may be used when the voltage level of the input data signal DS1 is higher than the second reference level VLREF_M. When the voltage level of the input data signal DS1 is higher than the first reference level VLREF_H, the second bit LSB1 having the first logic level may be generated. When the voltage level of the input data signal DS1 is lower than the first reference level VLREF_H, the second bit LSB1 having the second logic level may be generated. For example, the third reference voltage VREF_L may be used when the voltage level of the input data signal DS1 is lower than the second reference level VLREF_M. When the voltage level of the input data signal DS1 is higher than the third reference level VLREF_L, the second bit LSB1 having the first logic level may be generated. When the voltage level of the input data signal DS1 is lower than the third reference level VLREF_L, the second bit LSB1 having the second logic level may be generated.

Figure 6:
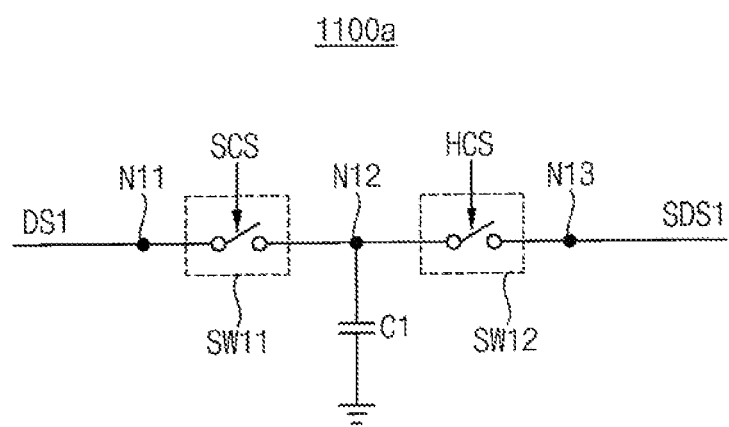
FIGS. 6, 7, and 8 are diagrams describing examples of a sample and hold circuit that is included in a receiver of FIG. 3.
Figure 7:
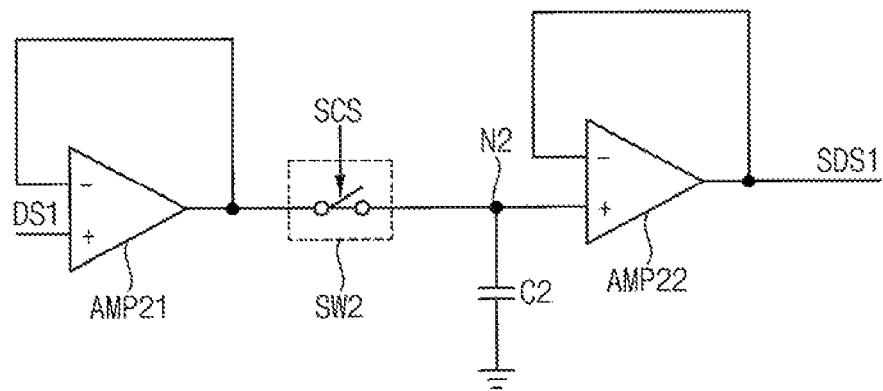
Figure 8:
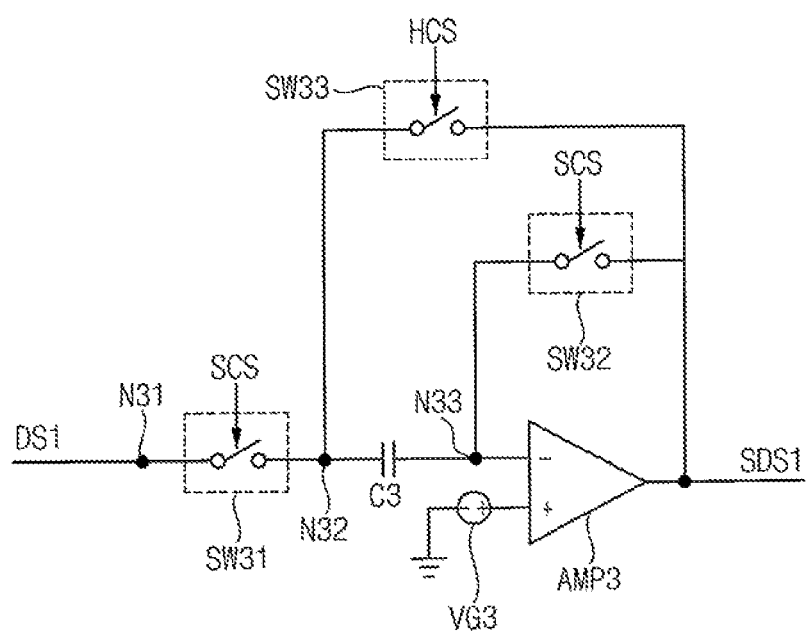

FIGS. 6, 7, and 8 are diagrams describing examples of a sample and hold circuit that is included in a receiver of FIG. 3.

Referring to FIG. 6, a sample and hold circuit 1100*a* may include a first switch SW11, a capacitor C1, and a second switch SW12.

The first switch SW11 may be connected between a first node N11 and a second node N12, and may be turned on and off based on the sample control signal SCS. The first node N11 may be a node receiving the input data signal DS1. The capacitor C1 may be connected between the second node N12 and a ground voltage. The second switch SW12 may be connected between the second node N12 and a third node N13, and may be turned on and off based on the hold control signal HCS. The third node N13 may be a node outputting the sample data signal SDS1.

Referring to FIG. 7, a sample and hold circuit 1100*b* may include a first amplifier AMP21, a switch SW2, a capacitor C2, and a second amplifier AMP22.

The first amplifier AMP21 may include a first input terminal (e.g., a positive (+) terminal) receiving the input data signal DS1, and may include a second input terminal (e.g., a negative (−) terminal) and an output terminal that are connected to each other. The switch SW2 may be connected between the output terminal of the first amplifier AMP21 and a first node N2, and may be turned on and off based on the sample control signal SCS. The capacitor C2 may be connected between the first node N2 and the ground voltage. The second amplifier AMP22 may include a first input terminal (e.g., a positive (+) terminal) connected to the first node N2, may include a second input terminal (e.g., a negative (−) terminal) and an output terminal that are connected to each other, and may output the sample data signal SDS1.

In the example of FIG. 7, each of the first and second amplifiers AMP21 and AMP22 may operate as an analog buffer (e.g., a unity gain buffer). Since the sample and hold circuit 1100b includes an analog buffer, the clock feedthrough may be prevented. Also, in the example of FIG. 7, the hold control signal HCS may be omitted.

Referring to FIG. 8, a sample and hold circuit 1100c may include a first switch SW31, a capacitor C3, a voltage generator VG3, an amplifier AMP3, a second switch SW32, and a third switch SW33.

The first switch SW31 may be connected between a first node N31 and a second node N32, and may be turned on and off based on the sample control signal SCS. The first node N31 may be a node receiving the input data signal DS1. The capacitor C3 may be connected between the second node N32 and a third node N33. The voltage generator VG3 may generate an offset voltage. The amplifier AMP3 may include a first input terminal (e.g., a positive (+) terminal) receiving the offset voltage, a second input terminal (e.g., a negative (−) terminal) connected to the third node N33, and an output terminal outputting the sample data signal SDS1. The second switch SW32 may be connected between the third node N33 and the output terminal of the amplifier AMP3, and may be turned on and off based on the sample control signal SCS. The third switch SW33 may be connected between the second node N32 and the output terminal of the amplifier AMP3, and may be turned on and off based on the hold control signal HCS.

In the example of FIG. 8, when it is assumed that a voltage of the input data signal DS1 is Vin and the offset voltage is Vos, a voltage of (Vin-Vos) may be stored in the capacitor C3. The sample and hold circuit 1100c may have an offset cancellation structure for generating the sample data signal SDS1 based on the voltage reduced by the offset voltage.

The sample and hold circuit 1100 may also be implemented with various structures for high-speed operation and/or various structures to solve factors that may interfere with high-speed operation.

Figure 9:
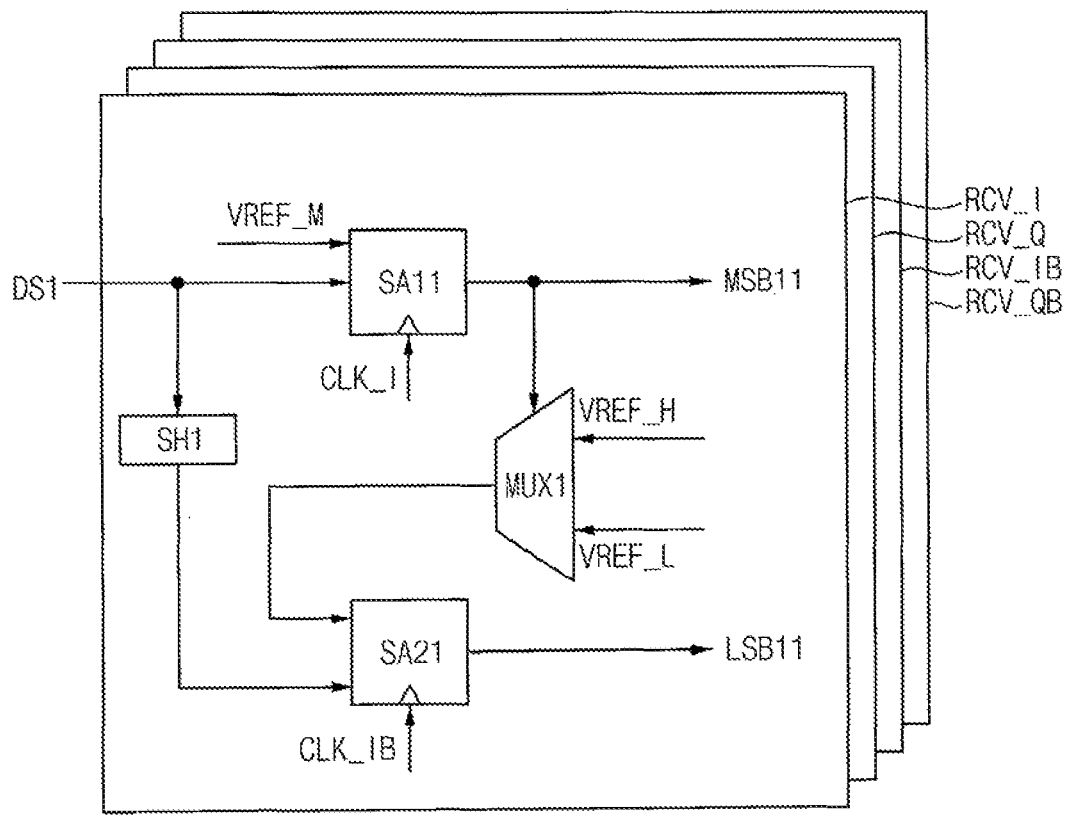
FIG. 9 is a block diagram illustrating an example of a receiver of FIG. 1.

FIG. 9 is a block diagram illustrating an example of a receiver of FIG. 1. The descriptions repeated with FIG. 3 will be omitted.

Referring to FIG. 9, a receiver 1000b may be implemented in a multi-stage structure that includes a first stage RCV_I, a second stage RCV_Q, a third stage RCV_IB, and a fourth stage RCV_QB. For example, to reduce the burden on the front stage and/or to more accurately determine the fine bit, the determination may be performed using the multi-stage structure.

Each of the first to fourth stages RCV_I, RCV_Q, RCV_IB, and RCV_QB may have a configuration substantially the same as that of the receiver 1000a of FIG. 3.

For example, the first stage RCV_I may include a sample and hold circuit SH1, a first sense amplifier SA11, a second sense amplifier SA21, and a multiplexer MUX1. The sample and hold circuit SH1, the first sense amplifier SA11, the second sense amplifier SA21, and the multiplexer MUX1 may correspond to the sample and hold circuit 1100, the first sense amplifier 1210, the second sense amplifier 1410, and the multiplexer 1310 in FIG. 3, respectively. In addition, clock signals CLK_I and CLK_IB and bits MSB11 and LSB11 associated with the components in the first stage RCV_I may correspond to the clock signals CLK and/CLK and the bits MSB1 and LSB1 in FIG. 3, respectively.

Although not illustrated in detail in FIG. 9, each of the second, third, and fourth stages RCV_Q, RCV_IB, and RCV_QB may have a configuration substantially the same as that of the first stage RCV_I. For example, the second stage RCV_Q may include a sample and hold circuit, a first sense amplifier (e.g., SA12 in FIG. 10), a second sense amplifier (e.g., SA22 in FIG. 10), and a multiplexer. The third stage RCV_IB may include a sample and hold circuit, a first sense amplifier (e.g., SA13 in FIG. 10), a second sense amplifier (e.g., SA23 in FIG. 10), and a multiplexer. The fourth stage RCV_QB may include a sample and hold circuit, a first sense amplifier (e.g., SA14 in FIG. 10), a second sense amplifier (e.g., SA24 in FIG. 10), and a multiplexer.

A general receiver operating based on the PAM4 scheme with four stages includes a total of twelve (=3*4) sense amplifiers for receiving the PAM4 signal. In contrast, the receiver 1000b according to the present example embodiment may include eight sense amplifiers and four sample and hold circuits, and may operate based on the pipelined scheme.

Figure 10:
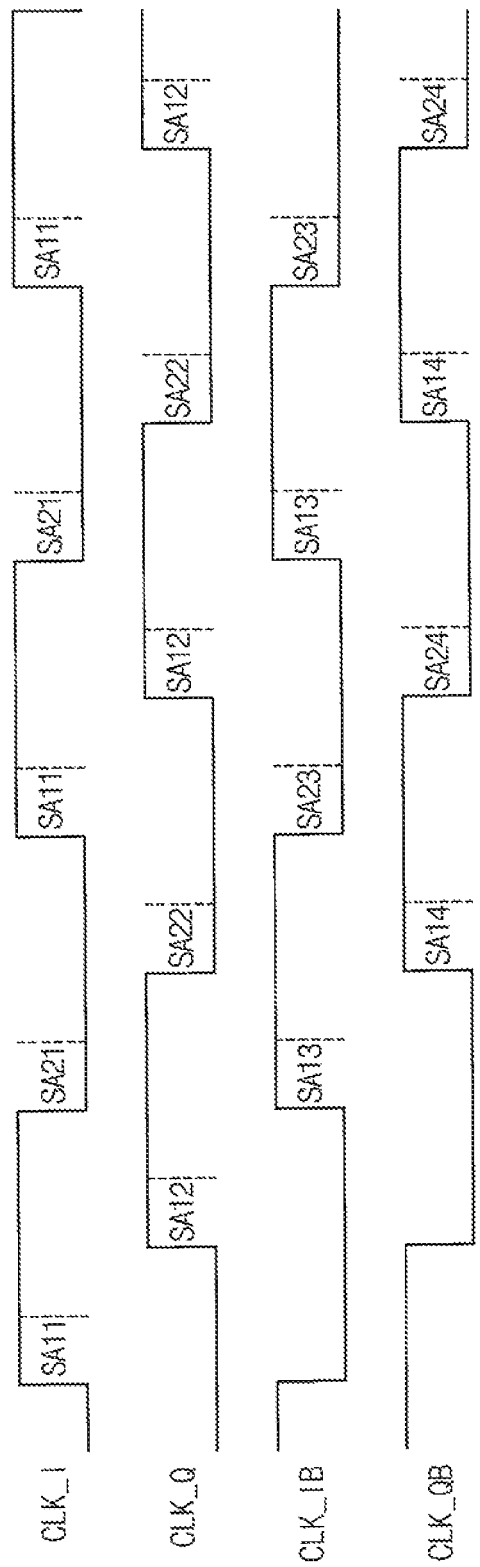
FIGS. 10, 11, and 12 are diagrams for describing an operation of a receiver of FIG. 9.
Figure 11:
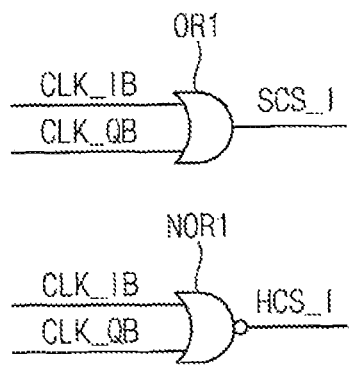
Figure 12:
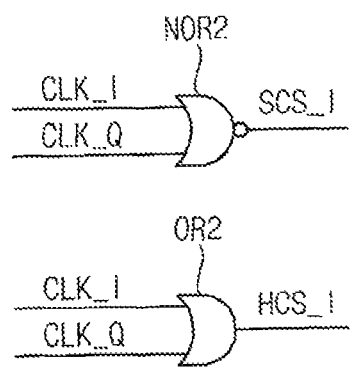

FIGS. 10, 11, and 12 are diagrams for describing an operation of a receiver of FIG. 9.

Referring to FIG. 10, operation timings of the clock signals CLK_I, CLK_Q, CLK_IB, and CLK_QB that are provided to the receiver 1000b are illustrated. The descriptions repeated with FIGS. 4 and 5 will be omitted.

The receiver 1000b may operate based on the clock signals CLK_I, CLK_Q, CLK_IB, and CLK_QB that are multi-phase clock signals. For example, phases of the clock signals CLK_I, CLK_Q, CLK_IB, and CLK_QB may partially overlap.

For example, the first and second sense amplifiers SA11 and SA21 in the first stage RCV_I may operate based on the clock signals CLK_I and CLK_IB having opposite phases, respectively. The first and second sense amplifiers SA12 and SA22 in the second stage RCV_Q may operate based on the clock signals CLK_Q and CLK_QB having opposite phases, respectively. The first and second sense amplifiers SA13 and SA23 in the third stage RCV_IB may operate based on the clock signals CLK_IB and CLK_I, respectively. The first and second sense amplifiers SA14 and SA24 in the fourth stage RCV_QB may operate based on the clock signals CLK_QB and CLK_Q, respectively.

An operation of each stage may be substantially the same as that described with reference to FIGS. 4 and 5. For convenience of illustration, the operations of the first and second sense amplifiers SA11 and SA21 in the first stage RCV_I are illustrated on the clock signal CLK_I, the operations of the first and second sense amplifiers SA12 and SA22 in the second stage RCV_Q are illustrated on the clock signal CLK_Q, the operations of the first and second sense amplifiers SA13 and SA23 in the third stage RCV_IB are illustrated on the clock signal CLK_IB, and the operations of the first and second sense amplifiers SA14 and SA24 in the fourth stage RCV_QB are illustrated on the clock signal CLK_QB.

Referring to FIGS. 11 and 12, examples of generating a sample control signal SCS_I and a hold control signal HCS_I that are provided to the sample and hold circuit SH1 in the first stage RCV_I are illustrated.

In an example embodiment, as illustrated in FIG. 11, an OR gate OR1 may generate the sample control signal SCS_I by performing an OR operation on the clock signals CLK_IB and CLK_QB in FIG. 10, and a NOR gate NOR1 may generate the hold control signal HCS_I by performing a NOR operation on the clock signals CLK_IB and CLK_QB.

In other example embodiments, as illustrated in FIG. 12, a NOR gate NOR2 may generate the sample control signal SCS_I by performing a NOR operation on the clock signals CLK_I and CLK_Q, and an OR gate OR2 may generate the hold control signal HCS_I by performing an OR operation on the clock signals CLK_I and CLK_Q.

Therefore, the receiver 1000b may not require an additional clock generator and/or a clock divider (e.g., circuit) for generating the sample control signal and the hold control signal.

Although not illustrated in detail, sample control signals and hold control signals that are provided to the sample and hold circuits included in the second, third, and fourth stages RCV_Q, RCV_IB, and RCV_QB may also be generated similarly to that described above.

Figure 13:
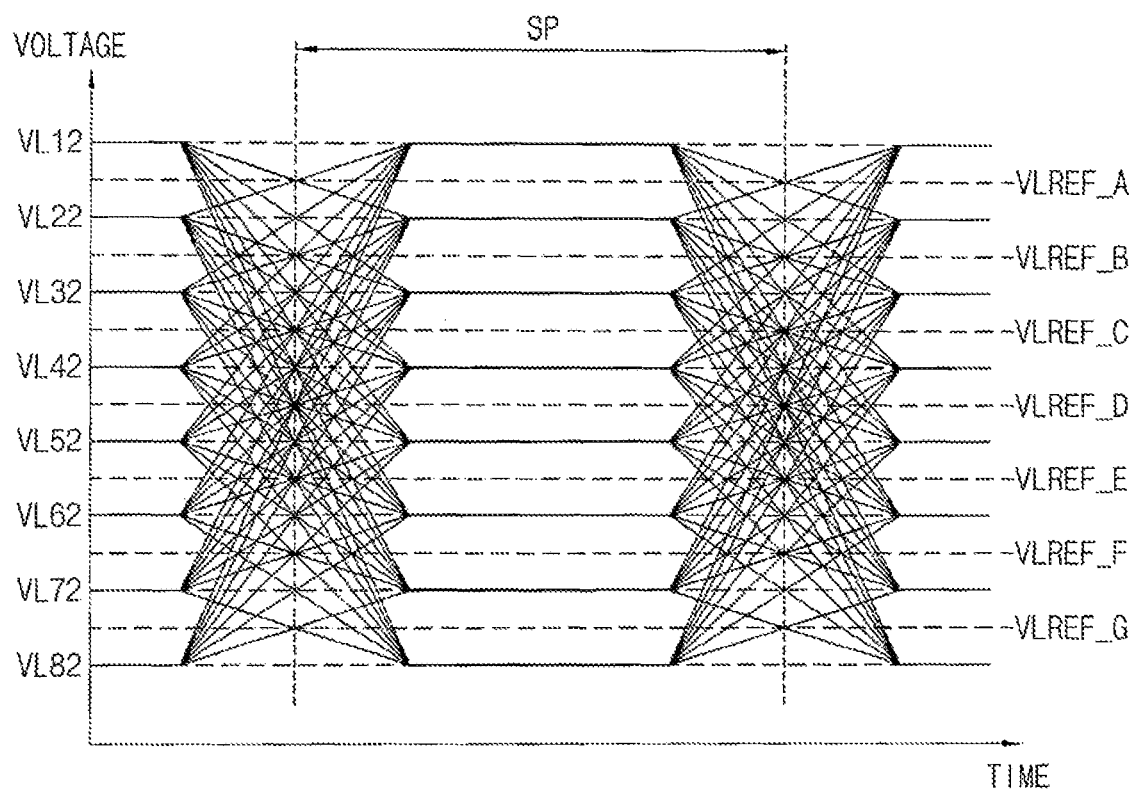
FIG. 13 is a diagram for describing a data signal that is input to a receiver according to an example embodiment.

FIG. 13 is a diagram for describing a data signal that is input to a receiver according to an example embodiment. FIG. 13 is a diagram illustrating a simplified ideal eye diagram of a data signal (e.g., a PAM8 signal) generated based on the 8-level scheme (e.g., the PAM8 scheme). The descriptions repeated with FIGS. 2A and 2B will be omitted.

Referring to FIG. 13, different first, second, third, fourth, fifth, sixth, seventh, and eighth voltage levels VL12, VL22, VL32, VL42, VL52, VL62, VL72, and VL82 of the data signal that is the PAM8 signal are illustrated, and different first, second, third, fourth, fifth, sixth, and seventh reference levels VLREF_A, VLREF_B, VLREF_C, VLREF_D, VLREF_E, VLREF_F, and VLREF_G for sensing or detecting the level of the data signal are illustrated.

The first voltage level VL12 may be the highest voltage level among the voltage levels VL12, VL22, VL32, VL42, VL52, VL62, VL72, and VL82. The second voltage level VL22 may be lower than the first voltage level VL12. The third voltage level VL32 may be lower than the second voltage level VL22. The fourth voltage level VL42 may be lower than the third voltage level VL32. The fifth voltage level VL52 may be lower than the fourth voltage level VL42. The sixth voltage level VL62 may be lower than the fifth voltage level VL52. The seventh voltage level VL72 may be lower than the sixth voltage level VL62. The eighth voltage level VL82 may be lower than the seventh voltage level VL72, and may be the lowest voltage level among the voltage levels VL12, VL22, VL32, VL42, VL52, VL62, VL72, and VL82.

The first reference level VLREF_A may be a voltage level between the first and second voltage levels VL12 and VL22. The second reference level VLREF_B may be a voltage level between the second and third voltage levels VL22 and VL32. The third reference level VLREF_C may be a voltage level between the third and fourth voltage levels VL32 and VL42. The fourth reference level VLREF_D may be a voltage level between the fourth and fifth voltage levels VL42 and VL52. The fifth reference level VLREF_E may be a voltage level between the fifth and sixth voltage levels VL52 and VL62. The sixth reference level VLREF_F may be a voltage level between the sixth and seventh voltage levels VL62 and VL72. The seventh reference level VLREF_G may be a voltage level between the seventh and eighth voltage levels VL72 and VL82.

Figure 14:
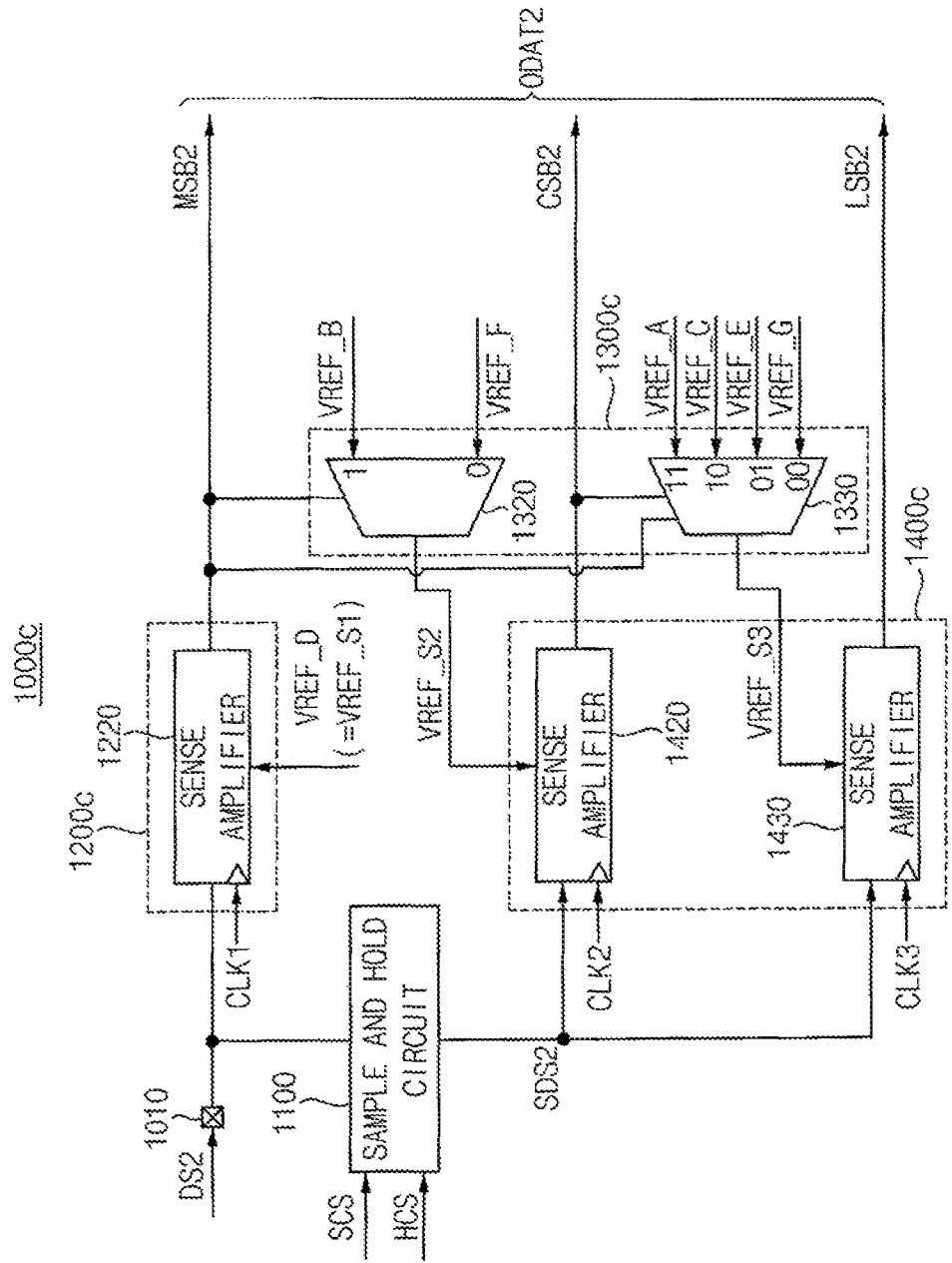
FIG. 14 is a block diagram illustrating an example of a receiver of FIG. 1.

FIG. 14 is a block diagram illustrating an example of a receiver of FIG. 1. The descriptions repeated with FIG. 3 will be omitted.

Referring to FIG. 14, a receiver 1000c may include a sample and hold circuit 1100, a data input pad 1010, a first analog-to-digital converting circuit 1200c, a digital-to-analog converting circuit 1300c, and a second analog-to-digital converting circuit 1400c.

The receiver 1000c may be a PAM8 receiver that receives an input data signal DS2 that is generated based on the PAM8 scheme and/or is the PAM8 signal.

The data input pad 1010 may receive the input data signal DS2 having one of the first, second, third, fourth, fifth, sixth, seventh, and eighth voltage levels VL12, VL22, VL32, VL42, VL52, VL62, VL72, and VL82 in FIG. 13 during one unit interval.

The sample and hold circuit 1100 may be substantially the same as the sample and hold circuit 1100 in FIGS. 1 and 3, and may output a sample data signal SDS2. The sample and hold circuit 1100 may be implemented as described with reference to FIGS. 6, 7, and 8.

The first analog-to-digital converting circuit 1200c may include a first sense amplifier 1220. The digital-to-analog converting circuit 1300c may include a first multiplexer 1320 and a second multiplexer 1330. The second analog-to-digital converting circuit 1400c may include a second sense amplifier 1420 and a third sense amplifier 1430.

The first sense amplifier 1220 may generate a first bit MSB2 of output data ODAT2 based on a first clock signal CLK1, the input data signal DS2, and a fourth reference voltage VREF_D. For example, the fourth reference voltage VREF_D may have the fourth reference level VLREF_D in FIG. 13, and the first bit MSB2 may be an MSB of the output data ODAT2. In the example of FIG. 14, the fourth reference voltage VREF_D may be determined and provided as the first selection reference voltage VREF_S1.

The first multiplexer 1320 may output one of a second reference voltage VREF_B and a sixth reference voltage VREF_F as a second selection reference voltage VREF_S2 based on the first bit MSB2 of the output data ODAT2. For example, the second reference voltage VREF_B may have the second reference level VLREF_B in FIG. 13, the sixth reference voltage VREF_F may have the sixth reference level VLREF_F in FIG. 13, and the second selection reference voltage VREF_S2 may be included in the at least one additional selection reference voltage VREF_SA.

In an example embodiment, when a voltage level of the input data signal DS2 is higher than the fourth reference level VLREF_D, the second reference voltage VREF_B may be determined and provided as the second selection reference voltage VREF_S2. When the voltage level of the input data signal DS2 is lower than the fourth reference level VLREF_D, the sixth reference voltage VREF_F may be determined and provided as the second selection reference voltage VREF_S2.

The second sense amplifier 1420 may generate a second bit CSB2 of the output data ODAT2 based on a second clock signal CLK2, the input data signal DS2, and the second selection reference voltage VREF_S2 (e.g., one of the second and sixth reference voltages VREF_B and VREF_F). For example, the second bit CSB2 may be a central significant bit (CSB) of the output data ODAT2.

The second multiplexer 1330 may output one of a first reference voltage VREF_A, a third reference voltage VREF_C, a fifth reference voltage VREF_E, and a seventh reference voltage VREF_G as a third selection reference voltage VREF_S3 based on the first and second bits MSB2 and CSB2 of the output data ODAT2. For example, the first reference voltage VREF_A may have the first reference level VLREF_A in FIG. 13, the third reference voltage VREF_C may have the third reference level VLREF_C in FIG. 13, the fifth reference voltage VREF_E may have the fifth reference level VLREF_E in FIG. 13, the seventh reference voltage VREF_G may have the seventh reference level VLREF_G in FIG. 13, and the third selection reference voltage VREF_S3 may be included in the at least one additional selection reference voltage VREF_SA.

In an example embodiment, when the voltage level of the input data signal DS2 is higher than the second reference level VLREF_B, the first reference voltage VREF_A may be determined and provided as the third selection reference voltage VREF_S3. When the voltage level of the input data signal DS2 is between the second and fourth reference levels VLREF_B and VLREF_D, the third reference voltage VREF_C may be determined and provided as the third selection reference voltage VREF_S3. When the voltage level of the input data signal DS2 is between the fourth and sixth reference levels VLREF_D and VLREF_F, the fifth reference voltage VREF_E may be determined and provided as the third selection reference voltage VREF_S3. When the voltage level of the input data signal DS2 is lower than the sixth reference level VLREF_F, the seventh reference voltage VREF_G may be determined and provided as the third selection reference voltage VREF_S3.

The third sense amplifier 1430 may generate a third bit LSB2 of the output data ODAT2 based on a third clock signal CLK3, the input data signal DS2, and the third selection reference voltage VREF_S3 (e.g., one of the first, third, fifth, and seventh reference voltages VREF_A, VREF_C, VREF_E, and VREF_G). For example, the third bit LSB2 may be an LSB of the output data ODAT2.

A general receiver operating based on the PAM8 scheme includes seven ($=2^3-1$) sense amplifiers for receiving the PAM8 signal. In contrast, the receiver 1000c according to an example embodiment may include three sense amplifiers 1220, 1420, and 1430 and one sample and hold circuit 1100, and may operate based on the pipelined scheme.

Figure 15:
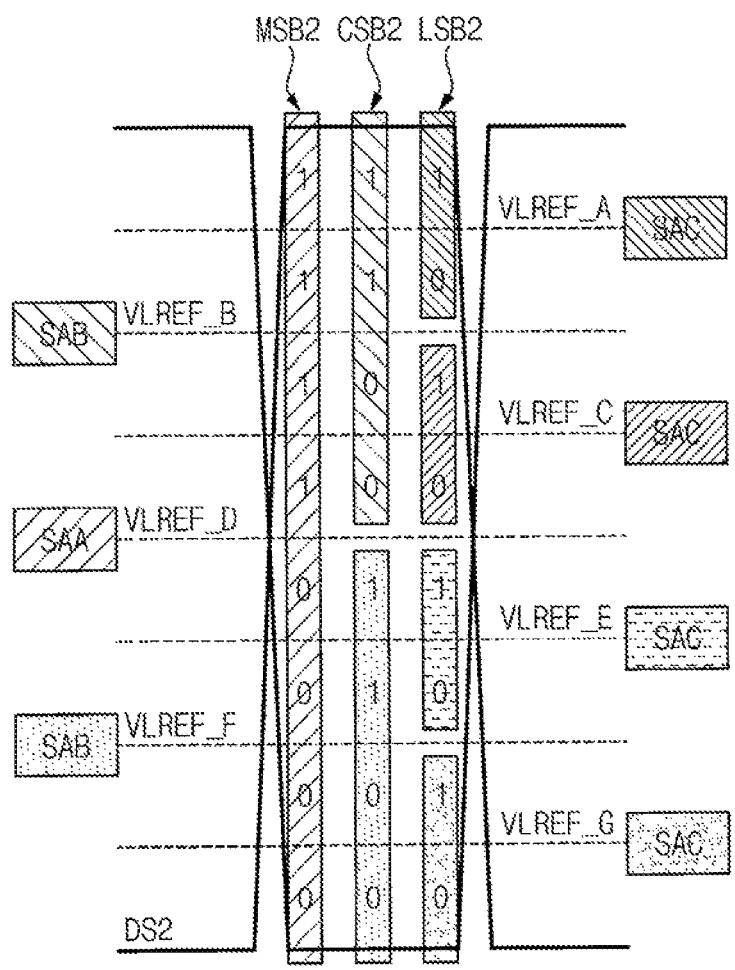
FIG. 15 is a diagram for describing an operation of a receiver of FIG. 14.

FIG. 15 is a diagram for describing an operation of a receiver of FIG. 14. The descriptions repeated with FIGS. 4 and 5 will be omitted.

Referring to FIG. 15, an example where the voltage levels VL12, VL22, VL32, VL42, VL52, VL62, VL72, and VL82 of the input data signal DS2 received by the receiver 1000c are mapped to '111', '110', '101', '100', '011', '010', '001', and '000', respectively, is illustrated.

As with that described with reference to FIG. 4, while the receiver 1000c is operating, sampling intervals and holding intervals may be alternately arranged, and the first bit MSB2, the second bit CSB2, and the third bit LSB3 of the output data ODAT2 may be sequentially determined and generated based on the pipeline scheme during a first sub-time interval, a second sub-time interval, and a third sub-time interval in the holding interval.

For example, in the first sub-time interval, the first sense amplifier SAA may determine the first bit MSB2 of the output data ODAT2 based on the fourth reference voltage VREF_D having the fourth reference level VLREF_D. For example, the first bit MSB2 having a first logic level (e.g., '1') or a second logic level (e.g., '0') may be generated by comparing the voltage level of the input data signal DS2 with the fourth reference level VLREF_D.

In the second sub-time interval, the second sense amplifier SAB may determine the second bit CSB2 of the output data ODAT2 based on the second reference voltage VREF_B having the second reference level VLREF_B or the sixth reference voltage VREF_F having the sixth reference level VLREF_F. For example, the second reference voltage VREF_B may be used when the voltage level of the input data signal DS2 is higher than the fourth reference level VLREF_D. The second bit CSB2 having the first logic level or the second logic level may be generated by comparing the voltage level of the input data signal DS2 with the second reference level VLREF_B. For example, the sixth reference voltage VREF_F may be used when the voltage level of the input data signal DS2 is lower than the fourth reference level VLREF_D. The second bit CSB2 having the first logic level or the second logic level may be generated by comparing the voltage level of the input data signal DS2 with the sixth reference level VLREF_F.

In the third sub-time interval, the second sense amplifier SAC may determine the third bit LSB2 of the output data ODAT2 based on the first reference voltage VREF_A having the first reference level VLREF_A, the third reference voltage VREF_C having the third reference level VLREF_C, the fifth reference voltage VREF_E having the fifth reference level VLREF_E, or the seventh reference voltage VREF_G having the seventh reference level VLREF_G. For example, the first reference voltage VREF_A may be used when the voltage level of the input data signal DS2 is higher than the second reference level VLREF_B. The third bit LSB2 having the first logic level or the second logic level may be generated by comparing the voltage level of the input data signal DS2 with the first reference level VLREF_A. For example, the third reference voltage VREF_C may be used when the voltage level of the input data signal DS2 is between the second and fourth reference levels VLREF_B and VLREF_D. The third bit LSB2 having the first logic level or the second logic level may be generated by comparing the voltage level of the input data signal DS2 with the third reference level VLREF_C. For example, the fifth reference voltage VREF_E may be used when the voltage level of the input data signal DS2 is between the fourth and sixth reference levels VLREF_D and VLREF_F. The third bit LSB2 having the first logic level or the second logic level may be generated by comparing the voltage level of the input data signal DS2 with the fifth reference level VLREF_E. For example, the seventh reference voltage VREF_G may be used when the voltage level of the input data signal DS2 is lower than the sixth reference level VLREF_F. The third bit LSB2 having the first logic level or the second logic level may be generated by comparing the voltage level of the input data signal DS2 with the seventh reference level VLREF_G.

In an example embodiment, the receiver 1000c of FIG. 14 may also be implemented with the multi-stage structure described with reference to FIG. 9.

Although example embodiments are described based on the PAM4 scheme and the PAM8 scheme, a receiver according to an example embodiment may include X sense amplifiers and one sample and hold circuit, and may operate based on the pipelined scheme, rather than a conventional receiver including ($2^X-1$) sense amplifiers.

Figure 16:
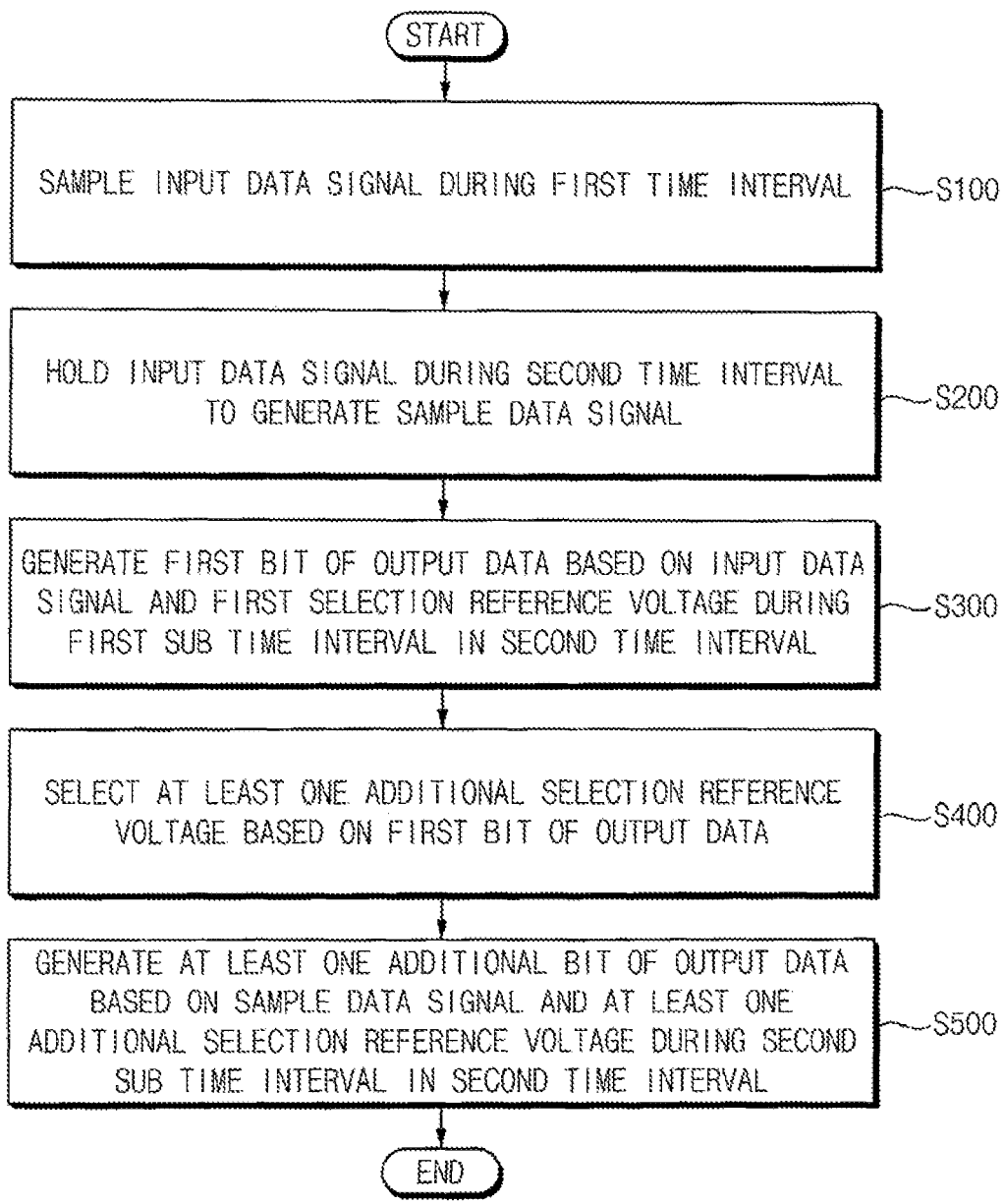
FIG. 16 is a flowchart illustrating a method of receiving a multi-level signal according to an example embodiment.

FIG. 16 is a flowchart illustrating a method of receiving a multi-level signal according to an example embodiment.

Referring to FIGS. 1 and 16, in a method of receiving a multi-level signal according to an example embodiment, the sample and hold circuit 1100 samples the input data signal DS, which is a multi-level signal, during a first time interval (e.g., the sampling interval) (operation S100), and holds the input data signal DS during a second time interval (e.g., the holding interval), which is subsequent to the first interval, to generate the sample data signal SDS (operation S200).

The first analog-to-digital converting circuit 1200 generates the first bit B1 of the output data ODAT, which is the multi-bit data, based on the input data signal DS and the first selection reference voltage VREF_S1 among the plurality of reference voltages VREF during a first sub-time interval in the second time interval (operation S300).

The digital-to-analog converting circuit 1300 selects the at least one additional selection reference voltage VREF_SA from among the plurality of reference voltages VREF based on the first bit B1 of the output data ODAT (operation S400). The at least one additional selection reference voltage VREF_SA is different from the first selection reference voltage VREF_S1.

The second analog-to-digital converting circuit 1400 generates the at least one additional bit BA of the output data ODAT based on the sample data signal SDS and the at least one additional selection reference voltage VREF_SA during a second sub-time interval, which is subsequent to the first sub-time interval, in the second time interval (operation S500). The at least one additional bit BA is different from the first bit B1.

Figure 17:
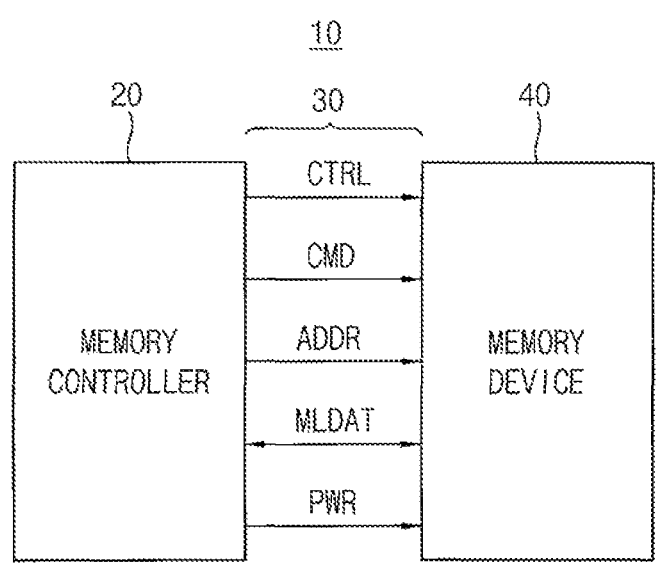
FIG. 17 is a block diagram illustrating a memory system according to an example embodiment.

FIG. 17 is a block diagram illustrating a memory system according to an example embodiment.

Referring to FIG. 17, a memory system 10 may include a memory controller 20, a memory device 40, and a plurality of signal lines 30 that electrically connect the memory controller 20 with the memory device 40.

The memory device 40 is controlled by the memory controller 20. For example, based on requests from a host device (not illustrated), the memory controller 20 may store (e.g., write or program) data into the memory device 40, or may retrieve (e.g., read or sense) data from the memory device 40.

The plurality of signal lines 30 may include control lines, command lines, address lines, data input/output (I/O) lines, and power lines. The memory controller 20 may transmit a command CMD, an address ADDR, and a control signal CTRL to the memory device 40 via the command lines, the address lines, and the control lines, may exchange a data signal MLDAT with the memory device 40 via the data I/O lines, and may transmit a power supply voltage PWR to the memory device 40 via the power lines. For example, the data signal MLDAT may be the multi-level signal that is received according to an example embodiment.

Although not illustrated in FIG. 17, the plurality of signal lines 30 may further include data strobe signal (DQS) lines for transmitting a DQS signal.

In an example embodiment, at least a part or all of the signal lines 30 may be referred to as a channel. The term "channel" as used herein may represent signal lines that include the data I/O lines for transmitting and receiving the data signal MLDAT. However, the channel may further include the command lines for transmitting the command CMD and/or the address lines for transmitting the address ADDR.

Figure 18A:
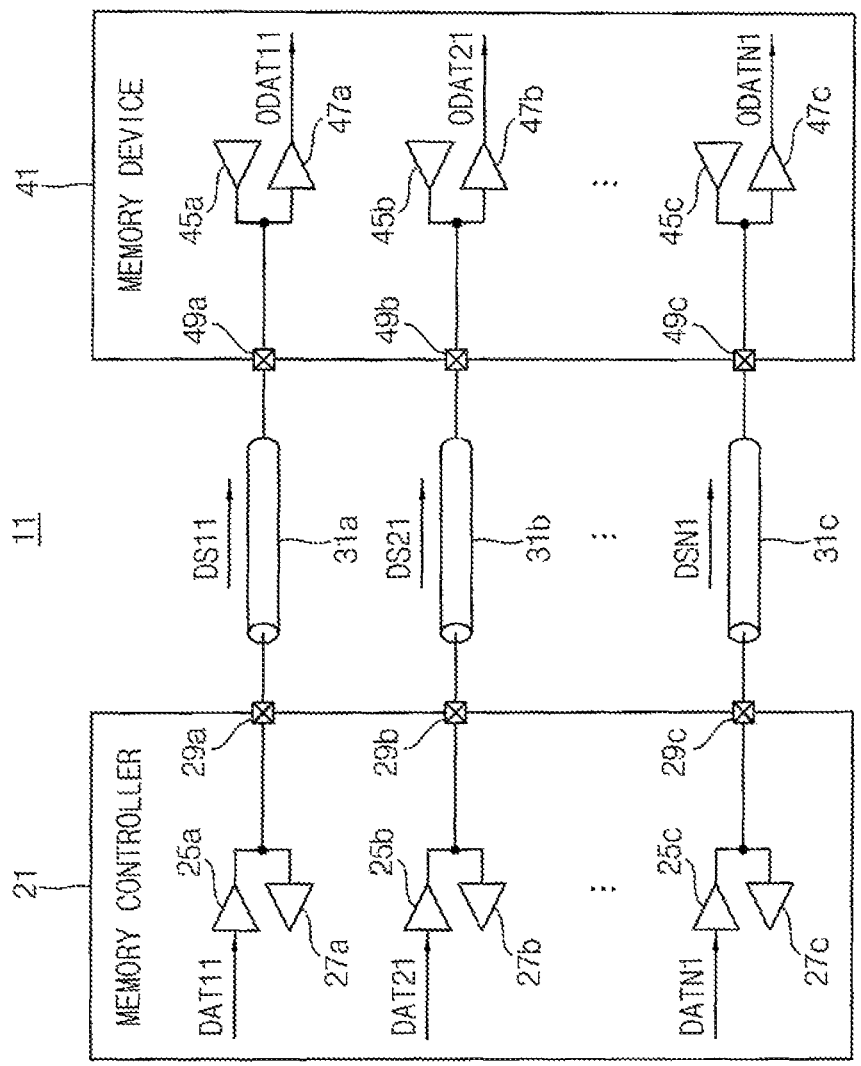
FIGS. 18A and 18B are block diagrams illustrating an example of a memory system of FIG. 17.
Figure 18B:
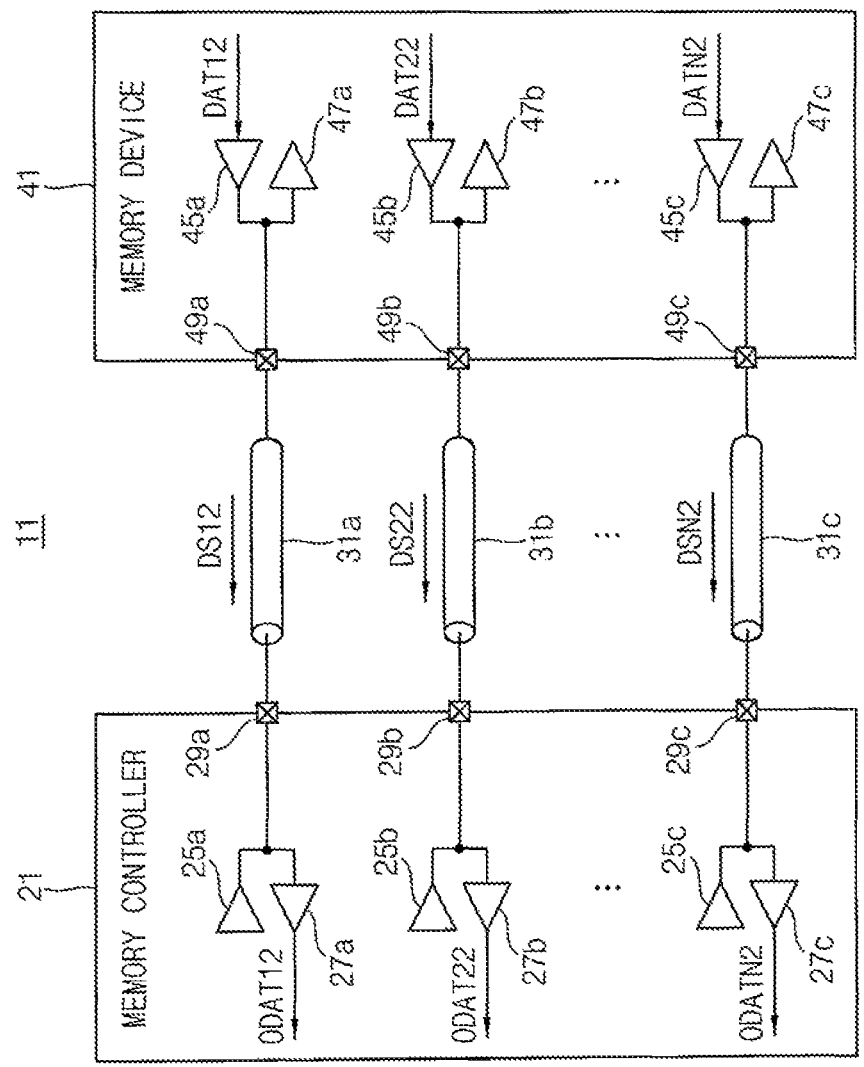

FIGS. 18A and 18B are block diagrams illustrating an example of a memory system of FIG. 17.

Referring to FIGS. 18A and 18B, a memory system 11 may include a memory controller 21, a memory device 41, and a plurality of channels 31a, 31b, . . . , and 31c. The number of the channels 31a, 31b, . . . , and 31c may be N, where N is a natural number greater than or equal to two.

The memory controller 21 may include a plurality of transmitters 25a, 25b, . . . , and 25c, a plurality of receivers 27a, 27b, . . . , and 27c, and a plurality of data I/O pads 29a, 29b, . . . , and 29c.

The memory device 41 may include a plurality of transmitters 45a, 45b, . . . , and 45c, a plurality of receivers 47a, 47b, . . . , and 47c, and a plurality of data I/O pads 49a, 49b, . . . , and 49c.

Each of the plurality of transmitters 25a, 25b, . . . , and 25c and 45a, 45b, . . . , and 45c may generate the multi-level signal. Each of the plurality of receivers 27a, 27b, . . . , and 27c and 47a, 47b, . . . , and 47c may receive the multi-level signal, and may be the receiver according to an example embodiment. For example, each of the plurality of receivers 27a, 27b, . . . , and 27c and 47a, 47b, . . . , and 47c may be the receiver which is described with reference to FIGS. 1 through 15.

Each of the plurality of data I/O pads 29a, 29b, . . . , and 29c and 49a, 49b, . . . , and 49c may be connected to a respective one of the plurality of transmitters 25a, 25b, . . . , and 25c and 45a, 45b, . . . , and 45c and a respective one of the plurality of receivers 27a, 27b, . . . , and 27c and 47a, 47b, . . . , and 47c.

The plurality of channels 31a, 31b, . . . , and 31c may connect the memory controller 21 with the memory device 41. Each of the plurality of channels 31a, 31b, . . . , and 31c may be connected to a respective one of the plurality of transmitters 25a, 25b, . . . , and 25c and a respective one of the plurality of receivers 27a, 27b, . . . , and 27c through a respective one of the plurality of data I/O pads 29a, 29b, . . . , and 29c. Similarly, each of the plurality of channels 31a, 31b, . . . , and 31c may be connected to a respective one of the plurality of transmitters 45a, 45b, . . . , and 45c and a respective one of the plurality of receivers 47a, 47b, . . . , and 47c through a respective one of the plurality of data I/O pads 49a, 49b, . . . , and 49c. The multi-level signal may be transmitted and received through each of the plurality of channels 31a, 31b, . . . , and 31c.

FIG. 18A illustrates an operation of transferring data from the memory controller 21 to the memory device 41. For example, the transmitter 25a may generate a data signal DS11, which is the multi-level signal, based on input data DAT11, the data signal DS11 may be transmitted from the memory controller 21 to the memory device 41 through the channel 31a, and the receiver 47a may receive the data signal DS11 to obtain output data ODAT11 corresponding to the input data DAT11. Similarly, the transmitter 25b may generate a data signal DS21, which is the multi-level signal, based on input data DAT21, the data signal DS21 may be transmitted to the memory device 41 through the channel 31b, and the receiver 47b may receive the data signal DS21 to obtain output data ODAT21 corresponding to the input data DAT21. The transmitter 25c may generate a data signal DSN1, which is the multi-level signal, based on input data DATN1, the data signal DSN1 may be transmitted to the memory device 41 through the channel 31c, and the receiver 47c may receive the data signal DSN1 to obtain output data ODATN1 corresponding to the input data DATN1. For example, the input data DAT11, DAT21, . . . , and DATN1 may be write data to be stored into the memory device 41, and a write command and a write address for storing the write data may be provided to the memory device 41 together with the write data.

FIG. 18B illustrates an operation of transferring data from the memory device 41 to the memory controller 21. For example, the transmitter 45a may generate a data signal DS12, which is the multi-level signal, based on input data DAT12, the data signal DS12 may be transmitted from the memory device 41 to the memory controller 21 through the channel 31a, and the receiver 27a may receive the data signal DS12 to obtain output data ODAT12 corresponding to the input data DAT12. Similarly, the transmitter 45b may generate a data signal DS22, which is the multi-level signal, based on input data DAT22, the data signal DS22 may be transmitted to the memory controller 21 through the channel 31*b*, and the receiver 27*b* may receive the data signal DS22 to obtain output data ODAT22 corresponding to the input data DAT22. The transmitter 45*c* may generate a data signal DSN2, which is the multi-level signal, based on input data DATN2, the data signal DSN2 may be transmitted to the memory controller 21 through the channel 31*c*, and the receiver 27*c* may receive the data signal DSN2 to obtain output data ODATN2 corresponding to the input data DATN2. For example, the input data DAT12, DAT22, . . . , and DATN2 may be read data retrieved from the memory device 41, and a read command and a read address for retrieving the read data may be provided to the memory device 41.

Figure 19:
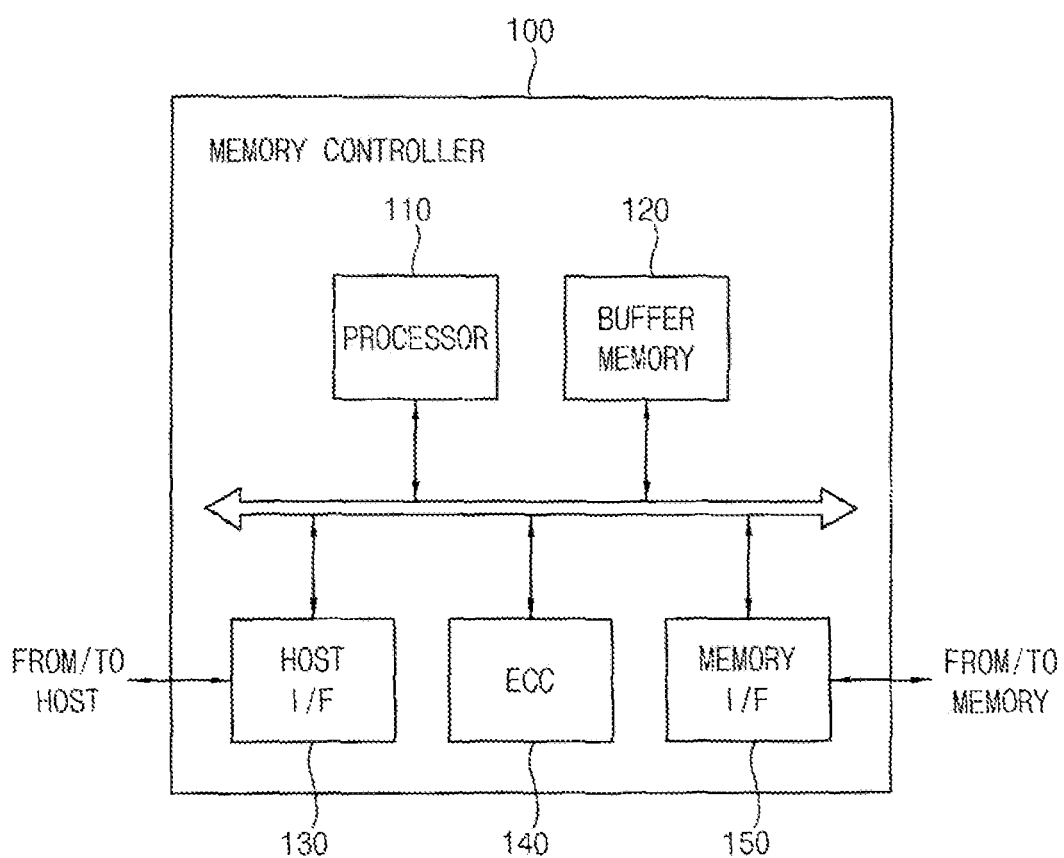
FIG. 19 is a block diagram illustrating an example of a memory controller that is included in a memory system according to an example embodiment.

FIG. 19 is a block diagram illustrating an example of a memory controller that is included in a memory system according to an example embodiment.

Referring to FIG. 19, a memory controller 100 may include at least one processor 110, a buffer memory 120, a host interface (I/F) 130, an error correction code (ECC) block 140, and a memory interface 150.

The processor 110 may control an operation of the memory controller 100 in response to a command and/or request received via the host interface 130 from an external host device (not illustrated). For example, the processor 110 may control respective components by employing firmware for operating a memory device (e.g., the memory device 40 in FIG. 17).

The buffer memory 120 may store instructions and data executed and processed by the processor 110. For example, the buffer memory 120 may be implemented with a volatile memory device such as a dynamic random access memory (DRAM), a static random access memory (SRAM), a cache memory, or the like.

The host interface 130 may provide physical connections between the host device and the memory controller 100. The host interface 130 may provide an interface corresponding to a bus format of the host device for communication between the host device and the memory controller 100. In an example embodiment, the bus format of the host device may be a small computer system interface (SCSI) or a serial attached SCSI (SAS) interface. In other example embodiments, the bus format of the host device may be a USB, a peripheral component interconnect express (PCIe), an advanced technology attachment (ATA), a parallel ATA (PATA), a serial ATA (SATA), a nonvolatile memory express (NVMe), etc., format.

The ECC block 140 for error correction may perform coded modulation using a Bose-Chaudhuri-Hocquenghem (BCH) code, a low density parity check (LDPC) code, a turbo code, a Reed-Solomon code, a convolution code, a recursive systematic code (RSC), a trellis-coded modulation (TCM), a block coded modulation (BCM), etc., or may perform ECC encoding and ECC decoding using above-described codes or other error correction codes.

The memory interface 150 may exchange data with the memory device. The memory interface 150 may transmit a command and an address to the memory device, and may transmit data to the memory device or receive data read from the memory device.

Although not illustrated in FIG. 19, a transmitter (e.g., the transmitter 25*a* in FIG. 18A) that generates the multi-level signal, and a receiver (e.g., the receiver 27*a* in FIG. 18A) that receives the multi-level signal according to an example embodiment, may be included in the memory interface 150.

Figure 20A:
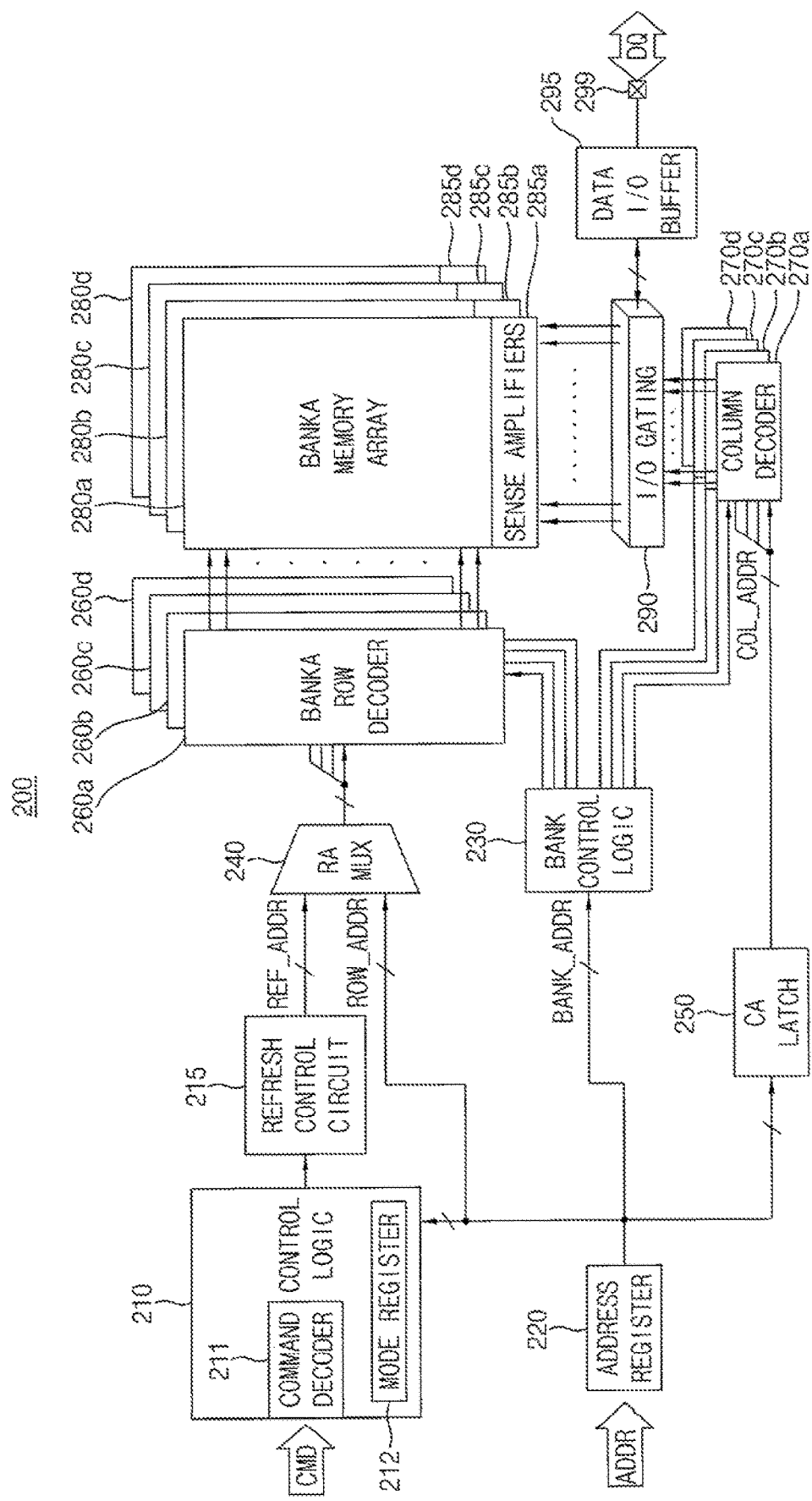
FIGS. 20A and 20B are block diagrams illustrating examples of a memory device that is included in a memory system according to an example embodiment.
Figure 20B:
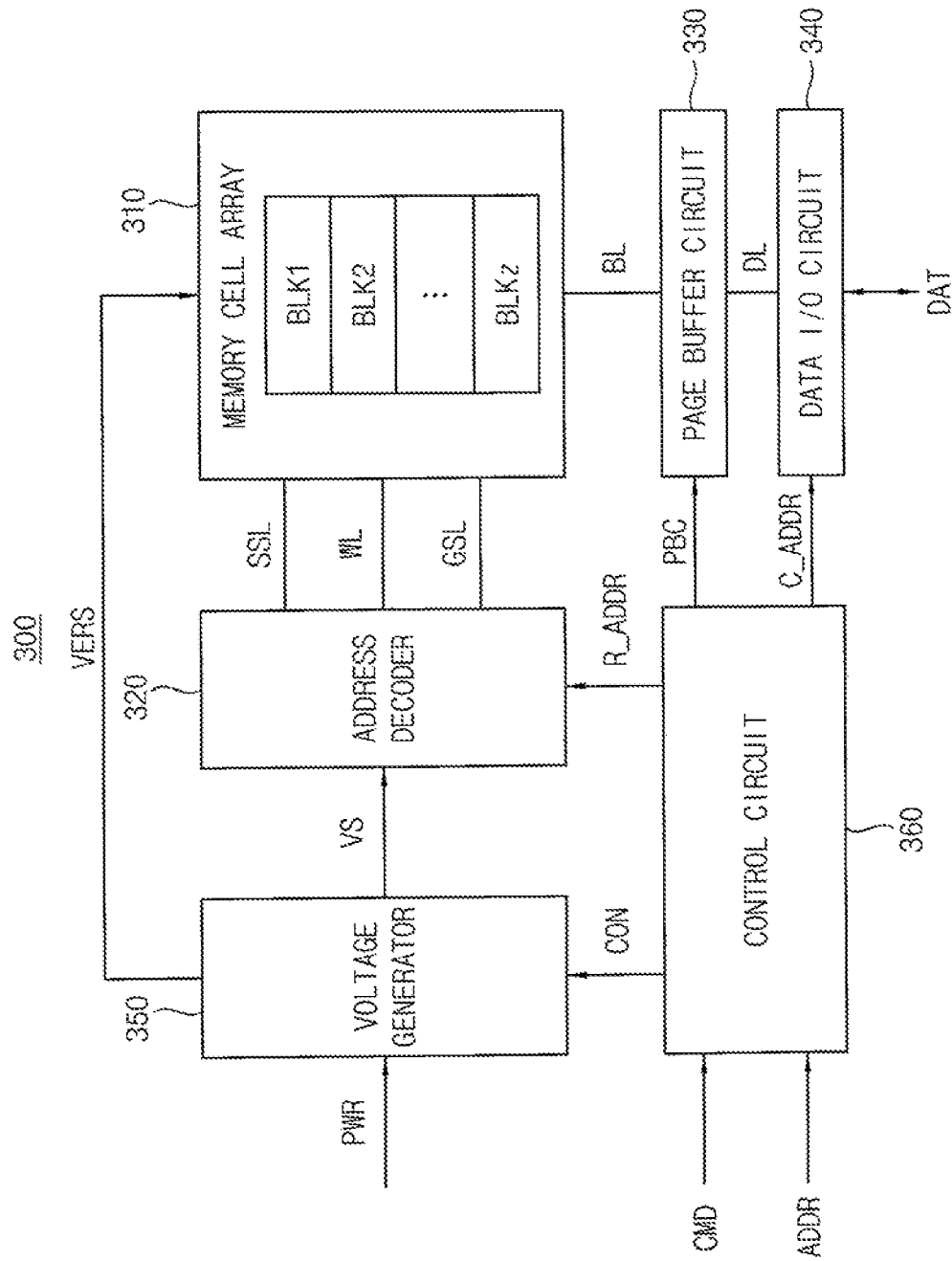

FIGS. 20A and 20B are block diagrams illustrating examples of a memory device that is included in a memory system according to an example embodiment.

Referring to FIG. 20A, a memory device 200 may include a control logic 210, a refresh control circuit 215, an address register 220, a bank control logic 230, a row address multiplexer 240, a column address latch 250, a row decoder, a column decoder, a memory cell array, a sense amplifier unit, an input/output (I/O) gating circuit 290, a data I/O buffer 295, and a data I/O pad 299. In an example embodiment, the memory device 200 may be, e.g., a volatile memory device. For example, the memory device 200 may be one of various volatile memory devices such as a dynamic random access memory (DRAM).

The memory cell array may include a plurality of memory cells. The memory cell array may include a plurality of bank arrays, e.g., first through fourth bank arrays 280*a*, 280*b*, 280*c*, and 280*d*. The row decoder may include a plurality of bank row decoders, e.g., first through fourth bank row decoders 260*a*, 260*b*, 260*c*, and 260*d* connected to the first through fourth bank arrays 280*a*, 280*b*, 280*c*, and 280*d*, respectively. The column decoder may include a plurality of bank column decoders, e.g., first through fourth bank column decoders 270*a*, 270*b*, 270*c*, and 270*d* connected to the first through fourth bank arrays 280*a*, 280*b*, 280*c*, and 280*d*, respectively. The sense amplifier unit may include a plurality of bank sense amplifiers, e.g., first through fourth bank sense amplifiers 285*a*, 285*b*, 285*c*, and 285*d* connected to the first through fourth bank arrays 280*a*, 280*b*, 280*c*, and 280*d*, respectively.

The first through fourth bank arrays 280*a* to 280*d*, the first through fourth bank row decoders 260*a* to 260*d*, the first through fourth bank column decoders 270*a* to 270*d*, and the first through fourth bank sense amplifiers 285*a* to 285*d* may form first through fourth banks, respectively. For example, the first bank array 280*a*, the first bank row decoder 260*a*, the first bank column decoder 270*a*, and the first bank sense amplifier 285*a* may form the first bank; the second bank array 280*b*, the second bank row decoder 260*b*, the second bank column decoder 270*b*, and the second bank sense amplifier 285*b* may form the second bank; the third bank array 280*c*, the third bank row decoder 260*c*, the third bank column decoder 270*c*, and the third bank sense amplifier 285*c* may form the third bank; and the fourth bank array 280*d*, the fourth bank row decoder 260*d*, the fourth bank column decoder 270*d*, and the fourth bank sense amplifier 285*d* may form the fourth bank.

The address register 220 may receive an address ADDR including a bank address BANK_ADDR, a row address ROW_ADDR, and a column address COL_ADDR from a memory controller (e.g., the memory controller 20 in FIG. 17). The address register 220 may provide the received bank address BANK_ADDR to the bank control logic 230, may provide the received row address ROW_ADDR to the row address multiplexer 240, and may provide the received column address COL_ADDR to the column address latch 250.

The bank control logic 230 may generate bank control signals in response to receipt of the bank address BANK_ADDR. One of the first through fourth bank row decoders 260*a* to 260*d* corresponding to the received bank address BANK_ADDR may be activated in response to the bank control signals generated by the bank control logic 230. One of the first through fourth bank column decoders 270*a* to 270*d* corresponding to the received bank address BANK_ADDR may be activated in response to the bank control signals generated by the bank control logic 230.

The refresh control circuit 215 may generate a refresh address REF_ADDR in response to receipt of a refresh command or entrance of any self refresh mode. For example, the refresh control circuit 215 may include a refresh counter that is configured to sequentially change the refresh address REF_ADDR from a first address of the memory cell array to a last address of the memory cell array. The refresh control circuit 215 may receive control signals from the control logic 210.

The row address multiplexer 240 may receive the row address ROW_ADDR from the address register 220, and may receive the refresh address REF_ADDR from the refresh control circuit 215. The row address multiplexer 240 may selectively output the row address ROW_ADDR or the refresh address REF_ADDR. A row address output from the row address multiplexer 240 (e.g., the row address ROW_ADDR or the refresh address REF_ADDR) may be applied to the first through fourth bank row decoders 260a to 260d.

The activated one of the first through fourth bank row decoders 260a to 260d may decode the row address output from the row address multiplexer 240, and may activate a wordline corresponding to the row address. For example, the activated bank row decoder may apply a wordline driving voltage to the wordline corresponding to the row address.

The column address latch 250 may receive the column address COL_ADDR from the address register 220, and may temporarily store the received column address COL_ADDR. The column address latch 250 may apply the temporarily stored or received column address COL_ADDR to the first through fourth bank column decoders 270a to 270d.

The activated one of the first through fourth bank column decoders 270a to 270d may decode the column address COL_ADDR output from the column address latch 250, and may control the I/O gating circuit 290 to output data corresponding to the column address COL_ADDR.

The I/O gating circuit 290 may include a circuitry for gating I/O data. For example, although not shown, the I/O gating circuit 290 may include an input data mask logic, read data latches for storing data output from the first through fourth bank arrays 280a to 280d, and write drivers for writing data to the first through fourth bank arrays 280a to 280d.

Data DQ to be read from one of the first through fourth bank arrays 280a to 280d may be sensed by a sense amplifier coupled to the one bank array, and may be stored in the read data latches. The data DQ stored in the read data latches may be provided to the memory controller via the data I/O buffer 295 and the data I/O pad 299. Data DQ received via the data I/O pad 299 that are to be written to one of the first through fourth bank arrays 280a to 280d may be provided from the memory controller to the data I/O buffer 295. The data DQ received via the data I/O pad 299 and provided to the data I/O buffer 295 may be written to the one bank array via the write drivers in the I/O gating circuit 290.

Although not illustrated in FIG. 20A, a transmitter (e.g., the transmitter 45a in FIG. 18A) that generates the multi-level signal and a receiver (e.g., the receiver 47a in FIG. 18A) that receives the multi-level signal according to an example embodiment may be included in the data I/O buffer 295.

The control logic 210 may control an operation of the memory device 200. For example, the control logic 210 may generate control signals for the memory device 200 to perform a data write operation or a data read operation. The control logic 210 may include a command decoder 211 that decodes a command CMD received from the memory controller, and a mode register 212 that sets an operation mode of the memory device 200.

Referring to FIG. 20B, a memory device 300 may include a memory cell array 310, an address decoder 320, a page buffer circuit 330, a data input/output (I/O) circuit 340, a voltage generator 350, and a control circuit 360. For example, the memory device 300 may be one of various nonvolatile memory devices such as a NAND flash memory device.

The memory cell array 310 may be connected to the address decoder 320 via a plurality of string selection lines SSL, a plurality of wordlines WL, and a plurality of ground selection lines GSL. The memory cell array 310 may be connected to the page buffer circuit 330 via a plurality of bitlines BL. The memory cell array 310 may include a plurality of memory cells (e.g., a plurality of nonvolatile memory cells) that are connected to the plurality of wordlines WL and the plurality of bitlines BL. The memory cell array 310 may be divided into a plurality of memory blocks BLK1, BLK2, . . . , and BLKz, each of which includes memory cells.

In an example embodiment, the plurality of memory cells may be arranged in a two-dimensional (2D) array structure or a three-dimensional (3D) vertical array structure. A three-dimensional vertical array structure may include vertical cell strings that are vertically oriented such that at least one memory cell is located over another memory cell. The at least one memory cell may include a charge trap layer. The following patent documents, which are hereby incorporated by reference in their entirety, describe suitable configurations for a memory cell array including a 3D vertical array structure, in which the three-dimensional memory array is configured as a plurality of levels, with wordlines and/or bitlines shared between levels: U.S. Pat. Nos. 7,679,133; 8,553,466; 8,654,587; and 8,559,235; and U.S. Pat. Pub. No. 2011/0233648.

The control circuit 360 may receive a command CMD and an address ADDR from the outside (e.g., from the memory controller 20 in FIG. 17), and may control erase, program, and read operations of the memory device 300 based on the command CMD and the address ADDR. The erase operation may include performing a sequence of erase loops. The program operation may include performing a sequence of program loops. Each program loop may include a program operation and a program verification operation. Each erase loop may include an erase operation and an erase verification operation. The read operation may include a normal read operation and data recovery read operation.

The control circuit 360 may generate control signals CON, which are used for controlling the voltage generator 350, and may generate control signal PBC for controlling the page buffer circuit 330, based on the command CMD, and may generate a row address R_ADDR and a column address C_ADDR based on the address ADDR. The control circuit 360 may provide the row address R_ADDR to the address decoder 320, and may provide the column address C_ADDR to the data I/O circuit 340.

The address decoder 320 may be connected to the memory cell array 310 via the plurality of string selection lines SSL, the plurality of wordlines WL, and the plurality of ground selection lines GSL. In the data erase/write/read operations, the address decoder 320 may determine at least one of the plurality of wordlines WL as a selected wordline, at least one of the plurality of string selection lines SSL as a selected string selection line, and at least one of the plurality of ground selection lines GSL as a selected ground selection line, based on the row address R_ADDR.

The voltage generator 350 may generate voltages VS that are used for an operation of the memory device 300 based on a power PWR and the control signals CON. The voltages VS may be applied to the plurality of string selection lines SSL, the plurality of wordlines WL, and the plurality of ground selection lines GSL via the address decoder 320. The voltage generator 350 may generate an erase voltage VERS that is used for the data erase operation based on the power PWR and the control signals CON.

The page buffer circuit 330 may be connected to the memory cell array 310 via the plurality of bitlines BL. The page buffer circuit 330 may include a plurality of page buffers. The page buffer circuit 330 may store data DAT to be programmed into the memory cell array 310, or may read data DAT sensed from the memory cell array 310. The page buffer circuit 330 may operate as a write driver or a sensing amplifier according to an operation mode of the memory device 300.

The data I/O circuit 340 may be connected to the page buffer circuit 330 via data lines DL. The data I/O circuit 340 may provide the data DAT from the outside of the memory device 300 to the memory cell array 310 via the page buffer circuit 330, or may provide the data DAT from the memory cell array 310 to the outside of the memory device 300, based on the column address C_ADDR.

Although not illustrated in FIG. 20B, a transmitter (e.g., the transmitter 45a in FIG. 18A) that generates the multi-level signal, and a receiver (e.g., the receiver 47a in FIG. 18A) that receives the multi-level signal according to an example embodiment may be included in the data I/O circuit 340.

Although the memory device included in the memory system according to an example embodiment is described based on a DRAM and a NAND flash memory, the memory device according to an example embodiment may be any volatile memory device, and/or any nonvolatile memory device, e.g., a static random access memory (SRAM), a phase random access memory (PRAM), a resistive random access memory (RRAM), a nano floating gate memory (NFGM), a polymer random access memory (PoRAM), a magnetic random access memory (MRAM), a ferroelectric random access memory (FRAM), a thyristor random access memory (TRAM), or the like.

Figure 21:
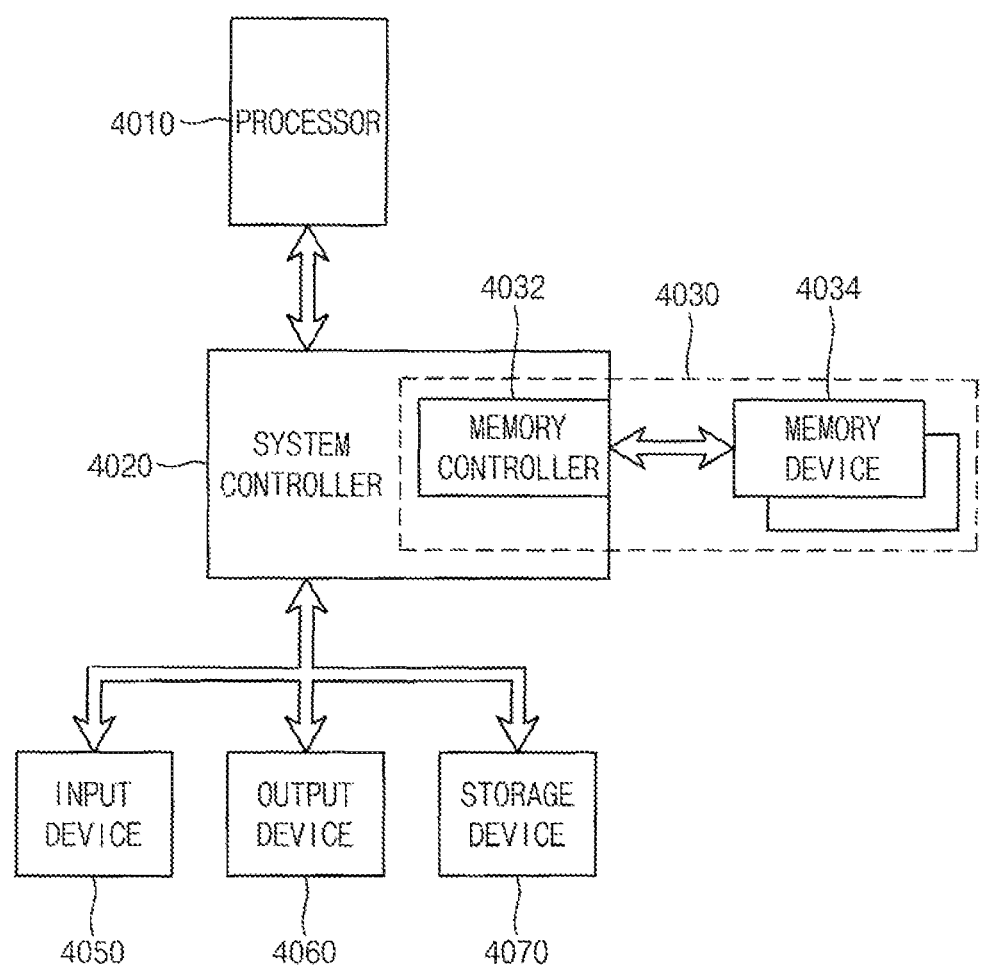
FIG. 21 is a block diagram illustrating a computing system according to an example embodiment.

FIG. 21 is a block diagram illustrating a computing system according to an example embodiment.

Referring to FIG. 21, a computing system 4000 may include a processor 4010, a system controller 4020, a memory system 4030, an input device 4050, an output device 4060, and a storage device 4070.

The memory system 4030 may include a plurality of memory devices 4034, and a memory controller 4032 for controlling the memory devices 4034. The memory controller 4032 may be included in the system controller 4020. The memory system 4030 may be a memory system according to an example embodiment, and may include a receiver according to an example embodiment.

The processor 4010 may perform various computing functions, such as executing specific software instructions for performing specific calculations or tasks. The processor 4010 may be connected to the system controller 4020 via a processor bus. The system controller 4020 may be connected to the input device 4050, the output device 4060, and the storage device 4070 via an expansion bus. As such, the processor 4010 may control the input device 4050, the output device 406,0 and the storage device 4070 using the system controller 4020.

Figure 22:
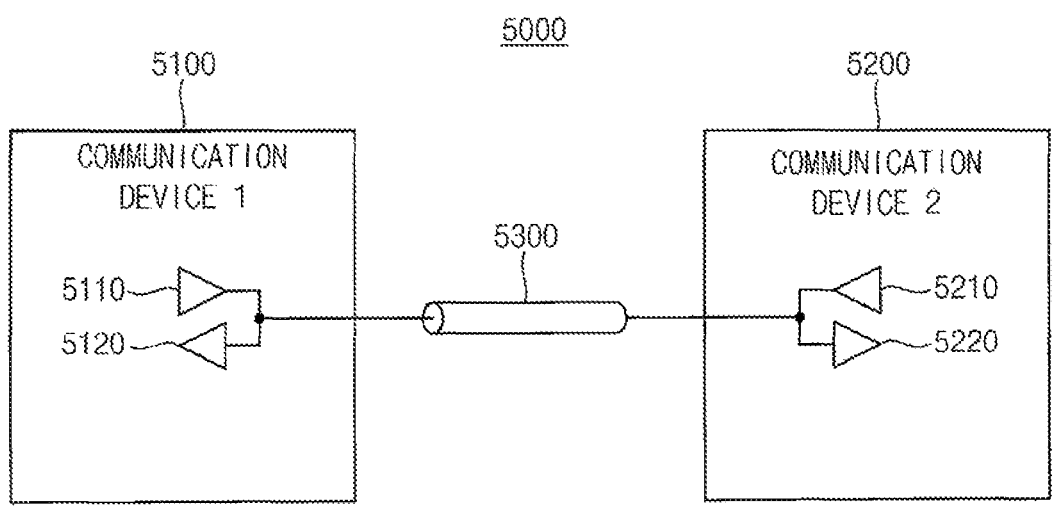
FIG. 22 is a block diagram illustrating a communication system according to an example embodiment.

FIG. 22 is a block diagram illustrating a communication system according to an example embodiment.

Referring to FIG. 22, a communication system 5000 may include a first communication device 5100, a second communication device 5200, and a channel 5300.

The first communication device 5100 may include a first transmitter 5110 and a first receiver 5120. The second communication device 5200 may include a second transmitter 5210 and a second receiver 5220. The first transmitter 5110 and the first receiver 5120 may be connected to the second transmitter 5210 and the second receiver 5220 through the channel 5300. The receivers 5120 and 5220 may be a receiver according to an example embodiment. In an example embodiment, each of the first and second communication devices 5100 and 5200 may include a plurality of transmitters and a plurality of receivers, and the communication system 5000 may include a plurality of channels for connecting the plurality of transmitters and a plurality of receivers.

Example embodiments may be applied to various electronic devices and systems that include a memory device or a memory system. For example, example embodiments may be applied to systems such as a personal computer (PC), a server computer, a data center, a workstation, a mobile phone, a smart phone, a tablet computer, a laptop computer, a personal digital assistant (PDA), a portable multimedia player (PMP), a digital camera, a portable game console, a music player, a camcorder, a video player, a navigation device, a wearable device, an internet of things (IOT) device, an internet of everything (IoE) device, an e-book reader, a virtual reality (VR) device, an augmented reality (AR) device, a robotic device, a drone, etc.

By way of summation and review, as performance of semiconductor memory devices has increased, communication speed (or interface speed) between a memory controller and a semiconductor memory device has also increased. Thus, multi-level signaling, in which a plurality of bits are transmitted during one unit interval (UI), has been researched.

As described above, embodiments may provide a receiver capable of reducing size and power consumption while a signal based on multi-level signaling is received. Embodiments may also provide a memory device including the receiver. In a receiver and a memory device according to an example embodiment, the receiver may operate based on a pipeline scheme in which the bits of the output data are determined at different timings. To operate based on the pipeline scheme, the receiver may include the sample and hold circuit and the analog-to-digital converting circuits, and thus the number of sense amplifiers included in the receiver may be reduced. Accordingly, a capacitance viewed from the input terminal to the inside of the receiver may be reduced, and the power consumption and circuit size may be reduced without degrading the performance of the receiver.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A receiver configured to receive a multi-level signal having three or more voltage levels that are different from each other, the receiver comprising:
   a sample and hold circuit configured to generate a sample data signal by sampling and holding an input data signal that is the multi-level signal;
   a first analog-to-digital converting circuit configured to generate a first bit of output data based on the input data signal and a first selection reference voltage among a plurality of reference voltages, the output data including at least the first bit and a second bit;
   a digital-to-analog converting circuit configured to select at least one additional selection reference voltage from among the plurality of reference voltages based on the first bit of the output data, the at least one additional selection reference voltage being different from the first selection reference voltage; and
   a second analog-to-digital converting circuit configured to generate at least the second bit of the output data based on the sample data signal and the at least one additional selection reference voltage.

2. The receiver as claimed in claim 1, wherein:
   the sample and hold circuit is configured to sample the input data signal during a first time interval, and to hold the input data signal during a second time interval subsequent to the first time interval,
   the first analog-to-digital converting circuit is configured to generate the first bit of the output data during a first sub-time interval in the second time interval, and
   the second analog-to-digital converting circuit is configured to generate at least the second bit of the output data during a second sub-time interval subsequent to the first sub-time interval in the second time interval.

3. The receiver as claimed in claim 1, wherein:
   the three or more voltage levels include a first voltage level, a second voltage level lower than the first voltage level, a third voltage level lower than the second voltage level, and a fourth voltage level lower than the third voltage level,
   the plurality of reference voltages include a first reference voltage having a first reference level between the first and second voltage levels, a second reference voltage having a second reference level between the second and third voltage levels, and a third reference voltage having a third reference level between the third and fourth voltage levels, and
   the output data includes the first bit and the second bit.

4. The receiver as claimed in claim 3, wherein:
   the second reference voltage is determined as the first selection reference voltage, and
   one of the first and third reference voltages is determined as a second selection reference voltage included in the at least one additional selection reference voltage.

5. The receiver as claimed in claim 4, wherein:
   in response to a voltage level of the input data signal being higher than the second reference level, the first reference voltage is determined as the second selection reference voltage, and
   in response to the voltage level of the input data signal being lower than the second reference level, the third reference voltage is determined as the second selection reference voltage.

6. The receiver as claimed in claim 4, wherein the first analog-to-digital converting circuit includes a first sense amplifier configured to generate the first bit of the output data based on a clock signal, the input data signal, and the second reference voltage.

7. The receiver as claimed in claim 6, wherein the second analog-to-digital converting circuit includes a second sense amplifier configured to generate the second bit of the output data based on an inverted clock signal, the input data signal, and one of the first and third reference voltages.

8. The receiver as claimed in claim 4, wherein the digital-to-analog converting circuit includes a multiplexer configured to output one of the first and third reference voltages as the second selection reference voltage based on the first bit of the output data.

9. The receiver as claimed in claim 3, wherein the sample and hold circuit includes:
   a first switch connected between a first node receiving the input data signal and a second node, and configured to be turned on and off based on a sample control signal;
   a capacitor connected between the second node and a ground voltage; and
   a second switch connected between the second node and a third node outputting the sample data signal, and configured to be turned on and off based on a hold control signal.

10. The receiver as claimed in claim 3, wherein the sample and hold circuit includes:
    a first amplifier including a first input terminal receiving the input data signal, and a second input terminal and an output terminal that are connected to each other;
    a switch connected between the output terminal of the first amplifier and a first node, and configured to be turned on and off based on a sample control signal;
    a capacitor connected between the first node and a ground voltage; and
    a second amplifier including a first input terminal connected to the first node, and a second input terminal and an output terminal that are connected to each other, and the second amplifier configured to output the sample data signal.

11. The receiver as claimed in claim 3, wherein the sample and hold circuit includes:
    a first switch connected between a first node receiving the input data signal and a second node, and configured to be turned on and off based on a sample control signal;
    a capacitor connected between the second node and a third node;
    an amplifier including a first input terminal receiving an offset voltage, a second input terminal connected to the third node, and an output terminal outputting the sample data signal;
    a second switch connected between the third node and the output terminal of the amplifier, and configured to be turned on and off based on the sample control signal; and
    a third switch connected between the second node and the output terminal of the amplifier, and configured to be turned on and off based on a hold control signal.

12. The receiver as claimed in claim 1, wherein:
    the three or more voltage levels include a first voltage level, a second voltage level lower than the first voltage level, a third voltage level lower than the second voltage level, a fourth voltage level lower than the third voltage level, a fifth voltage level lower than the fourth voltage level, a sixth voltage level lower than the fifth voltage level, a seventh voltage level lower than the sixth voltage level, and an eighth voltage level lower than the seventh voltage level, the plurality of reference voltages include a first reference voltage having a first reference level between the first and second voltage levels, a second reference voltage having a second reference level between the second and third voltage levels, a third reference voltage having a third reference level between the third and fourth voltage levels, a fourth reference voltage having a fourth reference level between the fourth and fifth voltage levels, a fifth reference voltage having a fifth reference level between the fifth and sixth voltage levels, a sixth reference voltage having a sixth reference level between the sixth and seventh voltage levels, and a seventh reference voltage having a seventh reference level between the seventh and eighth voltage levels, and the output data includes the first bit, the second bit, and a third bit.

13. The receiver as claimed in claim 12, wherein:

the fourth reference voltage is determined as the first selection reference voltage, one of the second and sixth reference voltages is determined as a second selection reference voltage included in the at least one additional selection reference voltage, and one of the first, third, fifth, and seventh reference voltages is determined as a third selection reference voltage included in the at least one additional selection reference voltage.

14. The receiver as claimed in claim 13, wherein:

in response to a voltage level of the input data signal being higher than the fourth reference level, the second reference voltage is determined as the second selection reference voltage, in response to the voltage level of the input data signal being lower than the fourth reference level, the sixth reference voltage is determined as the second selection reference voltage, in response to the voltage level of the input data signal being higher than the second reference level, the first reference voltage is determined as the third selection reference voltage, in response to the voltage level of the input data signal being between the second and fourth reference levels, the third reference voltage is determined as the third selection reference voltage, in response to the voltage level of the input data signal being between the fourth and sixth reference levels, the fifth reference voltage is determined as the third selection reference voltage, and in response to the voltage level of the input data signal being lower than the sixth reference level, the seventh reference voltage is determined as the third selection reference voltage.

15. The receiver as claimed in claim 12, wherein the first analog-to-digital converting circuit includes a first sense amplifier configured to generate the first bit of the output data based on a first clock signal, the input data signal, and the fourth reference voltage.

16. The receiver as claimed in claim 15, wherein the second analog-to-digital converting circuit includes:

a second sense amplifier configured to generate the second bit of the output data based on a second clock signal, the input data signal, and one of the second and sixth reference voltages; and a third sense amplifier configured to generate the third bit of the output data based on a third clock signal, the input data signal, and one of the first, third, fifth, and seventh reference voltages.

17. The receiver as claimed in claim 12, wherein the digital-to-analog converting circuit includes:

a first multiplexer configured to output one of the second and sixth reference voltages as the second selection reference voltage based on the first bit of the output data; and a second multiplexer configured to output one of the first, third, fifth, and seventh reference voltages as the third selection reference voltage based on the first and second bits of the output data.

18. The receiver as claimed in claim 1, wherein the input data signal is a single-ended signal.

19. A memory device, comprising:

a receiver configured to receive an input data signal that is a multi-level signal having three or more voltage levels that are different from each other; and a memory cell array configured to perform a data write operation based on the input data signal, wherein the receiver includes:

a sample and hold circuit configured to generate a sample data signal by sampling and holding the input data signal;

a first analog-to-digital converting circuit configured to generate a first bit of output data based on the input data signal and a first selection reference voltage among a plurality of reference voltages, the output data including the first bit and at least a second bit;

a digital-to-analog converting circuit configured to select at least one additional selection reference voltage from among the plurality of reference voltages based on the first bit of the output data, the at least one additional selection reference voltage being different from the first selection reference voltage; and a second analog-to-digital converting circuit configured to generate at least the second bit of the output data based on the sample data signal and the at least one additional selection reference voltage.

20. A receiver configured to receive a multi-level signal having a first voltage level, a second voltage level lower than the first voltage level, a third voltage level lower than the second voltage level, and a fourth voltage level lower than the third voltage level, the receiver comprising:

a sample and hold circuit configured to generate a sample data signal by sampling an input data signal that is the multi-level signal during a first time interval, and by holding the input data signal during a second time interval subsequent to the first time interval;

a first sense amplifier configured to generate a most significant bit (MSB) of output data based on the input data signal and a first reference voltage during a first sub-time interval in the second time interval, the first reference voltage having a voltage level between the second and third voltage levels;

a multiplexer configured to select one of a second reference voltage and a third reference voltage based on the MSB of the output data, the second reference voltage having a voltage level between the first and second voltage levels, the third reference voltage having a voltage level between the third and fourth voltage levels; and a second sense amplifier configured to generate a least significant bit (LSB) of the output data based on the sample data signal and one of the second and third reference voltages output from the multiplexer during a second sub-time interval subsequent to the first sub-time interval in the second time interval, wherein:
in response to a voltage level of the input data signal being higher than the voltage level of the first reference voltage, the MSB of the output data has a first logic level, and the multiplexer is configured to select and output the second reference voltage, and in response to the voltage level of the input data signal being lower than the voltage level of the first reference voltage, the MSB of the output data has a second logic level different from the first logic level, and the multiplexer is configured to select and output the third reference voltage.

* * * * *